US012127440B2

(12) United States Patent
Choi et al.

(10) Patent No.: US 12,127,440 B2
(45) Date of Patent: Oct. 22, 2024

(54) DISPLAY DEVICE

(71) Applicant: Samsung Display Co., LTD., Yongin-si (KR)

(72) Inventors: Jong Hyun Choi, Seoul (KR); Seung Hwan Cho, Yongin-si (KR); Tae Woo Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 366 days.

(21) Appl. No.: 17/630,879

(22) PCT Filed: Nov. 27, 2019

(86) PCT No.: PCT/KR2019/016502
§ 371 (c)(1),
(2) Date: Jan. 27, 2022

(87) PCT Pub. No.: WO2021/025234
PCT Pub. Date: Feb. 11, 2021

(65) Prior Publication Data
US 2022/0223667 A1 Jul. 14, 2022

(30) Foreign Application Priority Data

Aug. 2, 2019 (KR) ........................ 10-2019-0094488

(51) Int. Cl.
*H10K 59/122* (2023.01)
*H10K 50/844* (2023.01)
(Continued)

(52) U.S. Cl.
CPC ......... *H10K 59/122* (2023.02); *H10K 50/844* (2023.02); *H10K 50/865* (2023.02); *H10K 59/131* (2023.02)

(58) Field of Classification Search
CPC .. H10K 59/122; H10K 50/844; H10K 50/865; H10K 59/131; H10K 59/8723; H10K 59/8731
See application file for complete search history.

(56) References Cited

U.S. PATENT DOCUMENTS

| 10,573,235 B2 | 2/2020 | Cui et al. |
| 2015/0014650 A1 | 1/2015 | Lim et al. |

(Continued)

FOREIGN PATENT DOCUMENTS

| CN | 107870689 A | 4/2018 |
| CN | 207250521 U | 4/2018 |

(Continued)

OTHER PUBLICATIONS

International Search Report of PCT/KR2019/016502, May 1, 2020, 4 pages.

(Continued)

*Primary Examiner* — Donald L Raleigh
(74) *Attorney, Agent, or Firm* — Lewis Roca Rothgerber Christie LLP

(57) ABSTRACT

A display device includes: a substrate comprising a display region including main pixels, and a sensor region including auxiliary pixels and transmission areas; first anodes arranged so as to correspond to the main pixels; first pixel defining layers for defining openings which partially expose the first anodes; spacers provided on the first pixel defining layers and protruding in the thickness direction; second anodes arranged so as to correspond to the auxiliary pixels; and second pixel defining layers for defining openings which partially expose the second anodes. The spacers and the second pixel defining layers are simultaneously formed of the same material.

20 Claims, 18 Drawing Sheets

(51) Int. Cl.
  *H10K 50/86* (2023.01)
  *H10K 59/131* (2023.01)

(56) References Cited

U.S. PATENT DOCUMENTS

| | | |
|---|---|---|
| 2015/0102292 A1 | 4/2015 | Kim |
| 2016/0149156 A1 | 5/2016 | Kim et al. |
| 2016/0372506 A1 | 12/2016 | Wataya |
| 2018/0122863 A1 | 5/2018 | Bok |
| 2019/0131352 A1* | 5/2019 | Choi .................. H10K 59/35 |
| 2021/0376016 A1* | 12/2021 | Hou .................. H10K 71/00 |
| 2022/0077423 A1* | 3/2022 | Zhang .................. H10K 59/131 |

FOREIGN PATENT DOCUMENTS

| | | |
|---|---|---|
| CN | 108573993 A | 9/2018 |
| CN | 108538206 B | 2/2021 |
| KR | 2006-0076608 A | 7/2006 |
| KR | 2008-0054858 A | 6/2008 |
| KR | 2013-0107647 A | 10/2013 |
| KR | 2016-0062661 A | 6/2016 |
| KR | 2017-0096646 A | 8/2017 |
| KR | 10-2017-0142304 A | 12/2017 |
| KR | 10-2018-0011982 A | 2/2018 |
| KR | 2018-0115387 A | 10/2018 |

OTHER PUBLICATIONS

Chinese Office Action dated Jun. 4, 2024, issued in corresponding Chinese Patent Application No. 201980099072.7 (10 pages).
Korean Office Action for KR 10-2019-0094488 dated Jul. 19, 2024, 7 pages.

* cited by examiner

[FIG. 1]
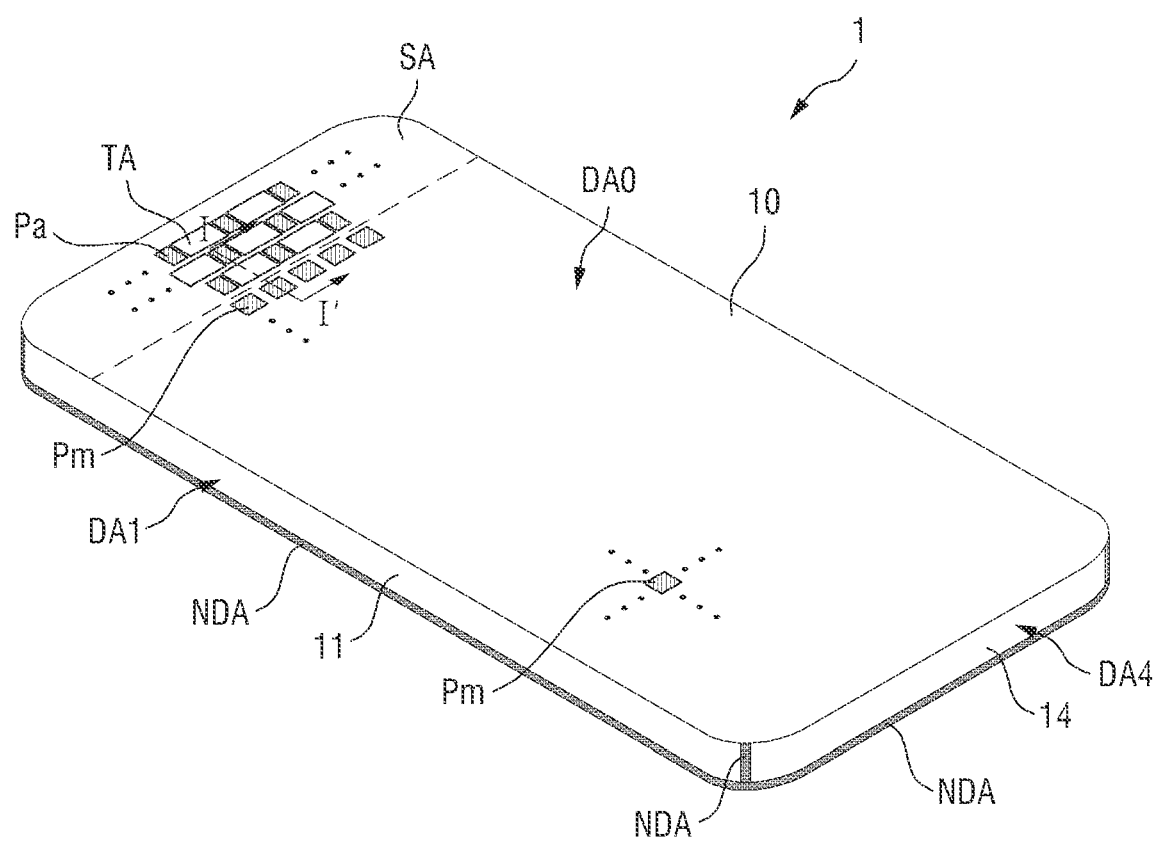

[FIG. 2]
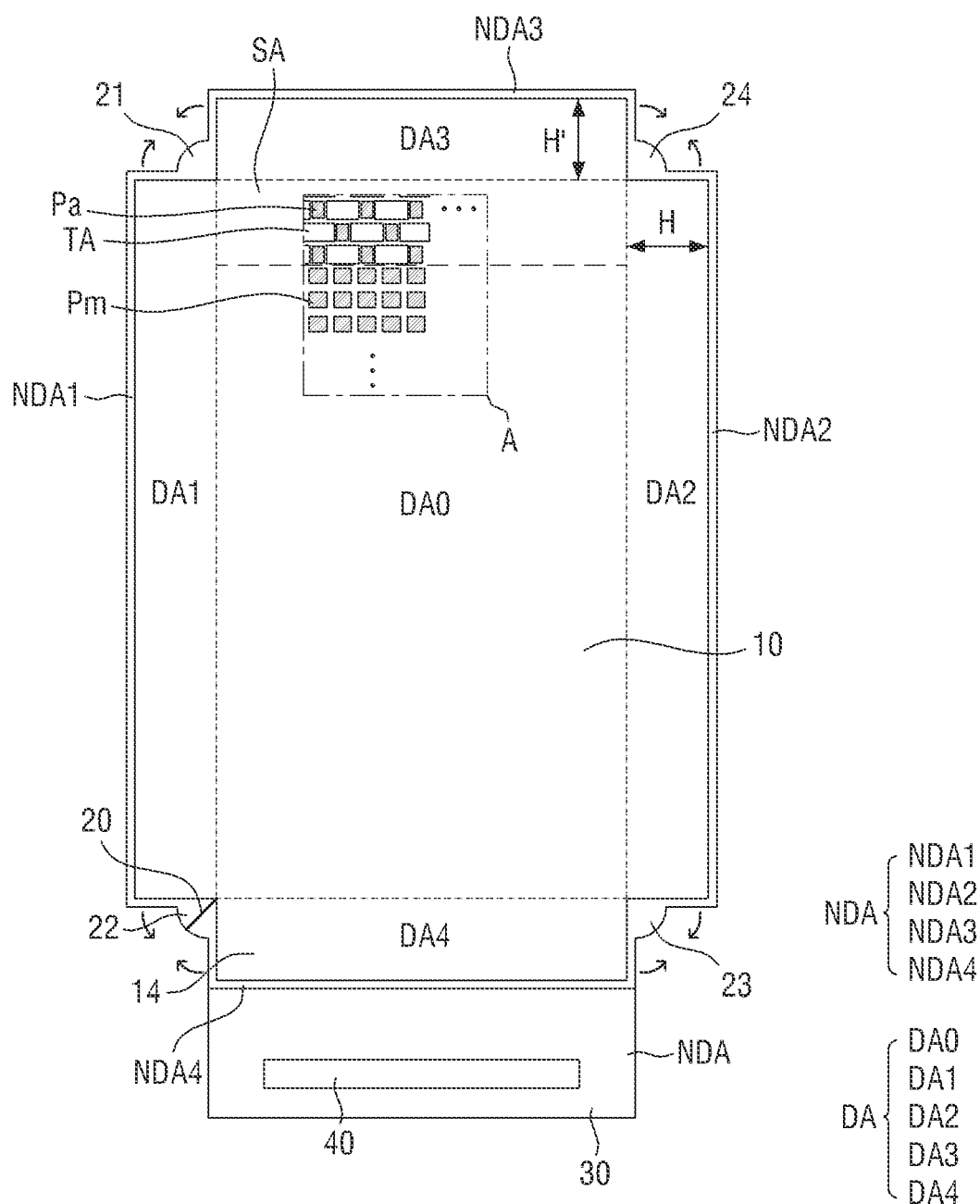

[FIG. 3]
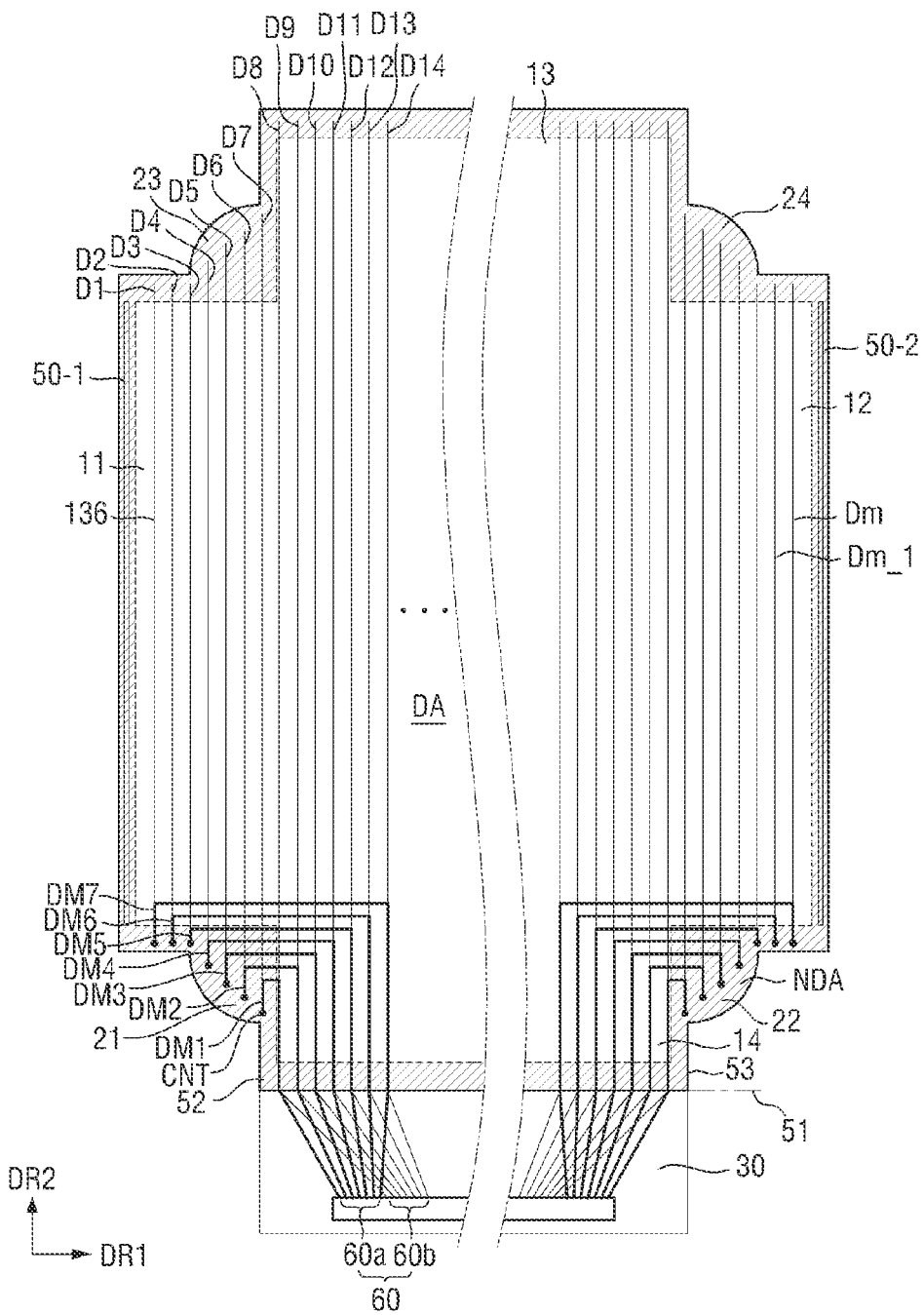
60a: 61a, 62a, 63a, 64a, 65a, 66a, 67a
60b: 61b, 62b, 63b, 64b, 65b, 66b, 67b
136: D1, D2, D3, D4, D5, D6, D7, D8, D9, D10, D11, D12, D13, D14
146: DM1, DM2, DM3, DM4, DM5, DM6, DM7

[FIG. 4]
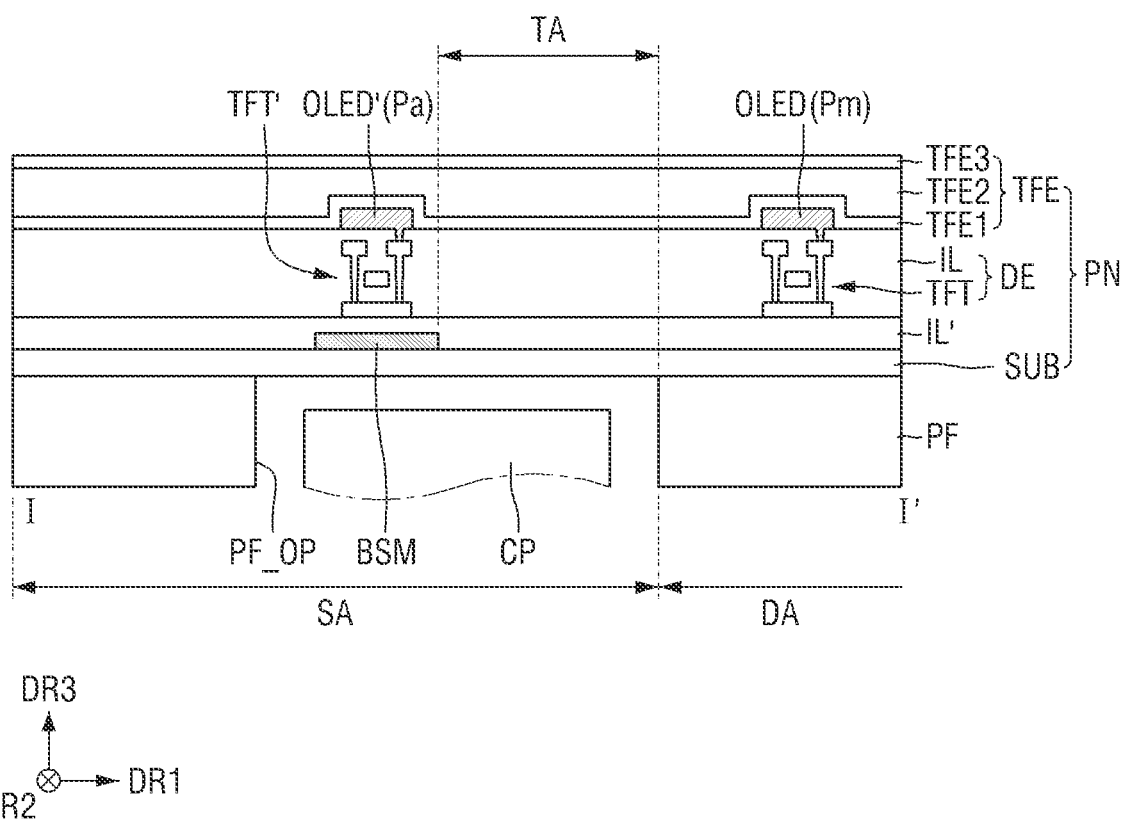

[FIG. 5]
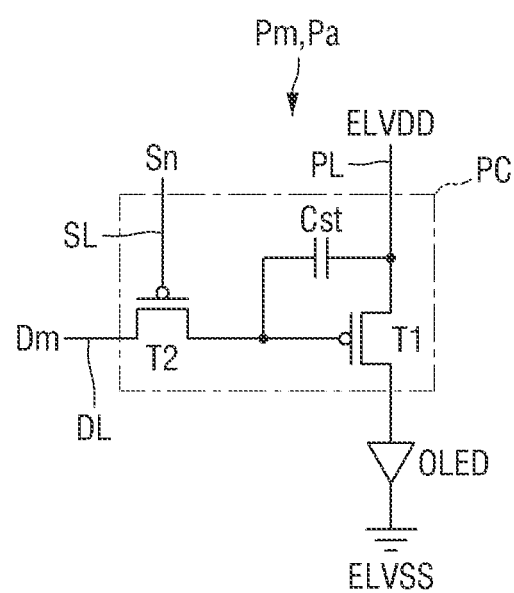

[FIG. 6]
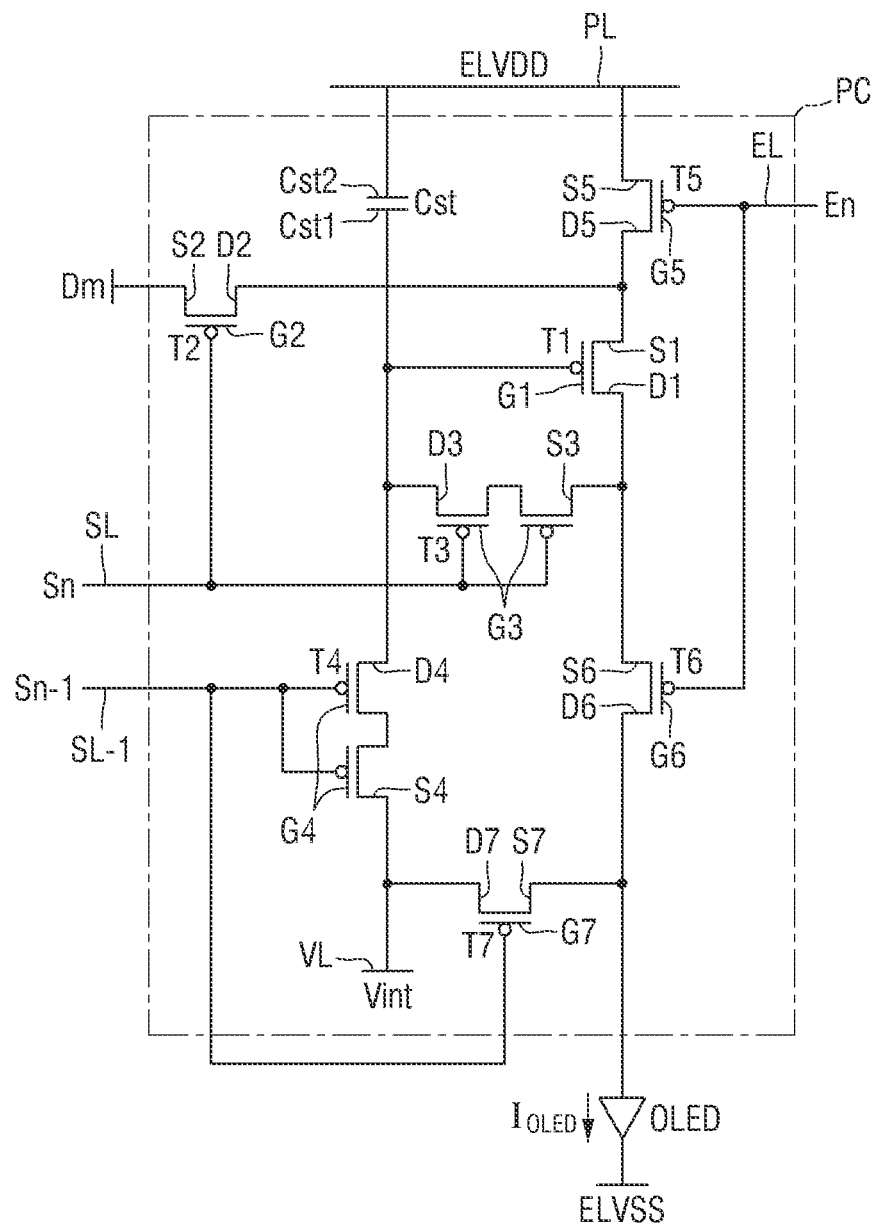

[FIG. 7]
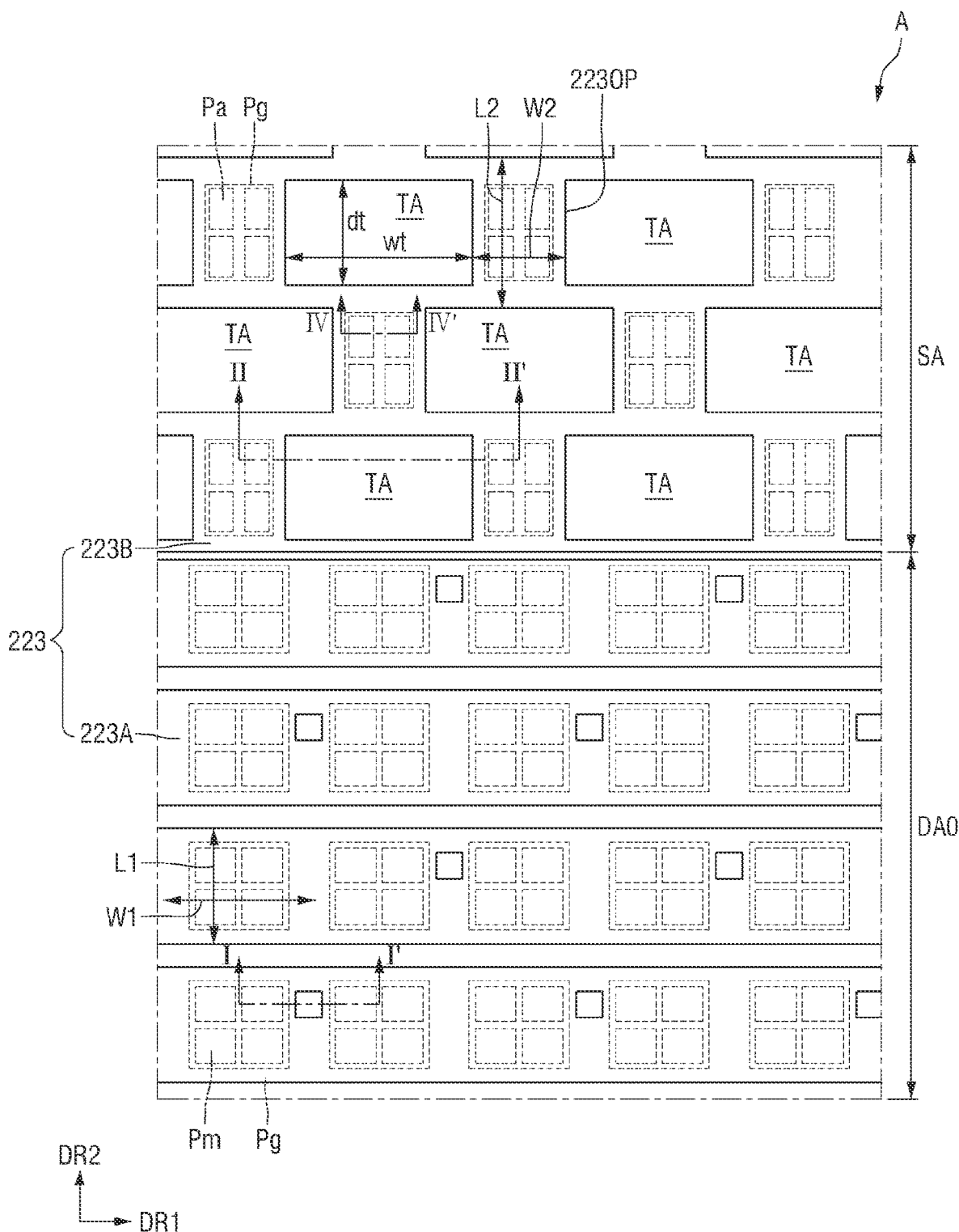

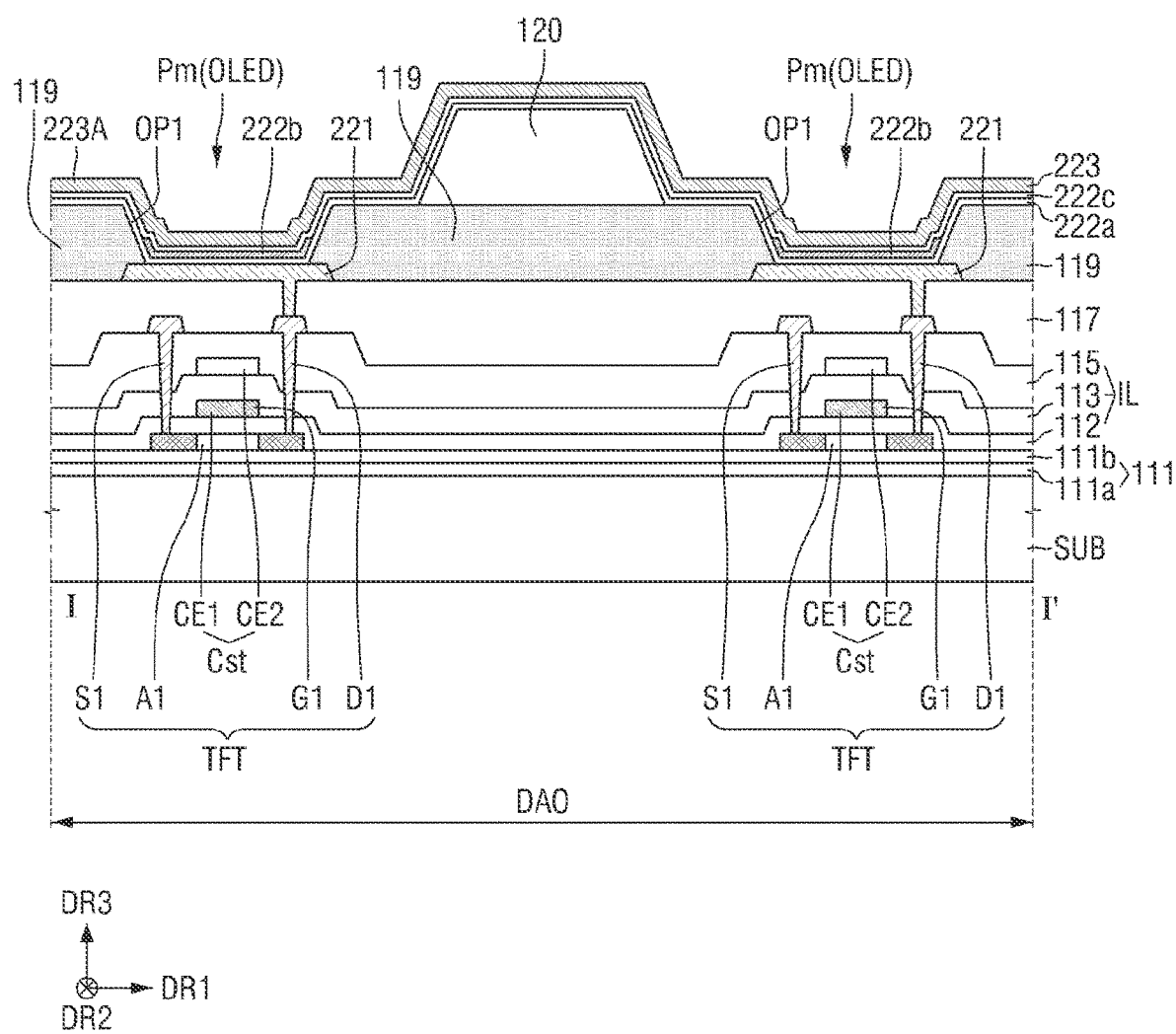
[FIG. 8]

[FIG. 9]
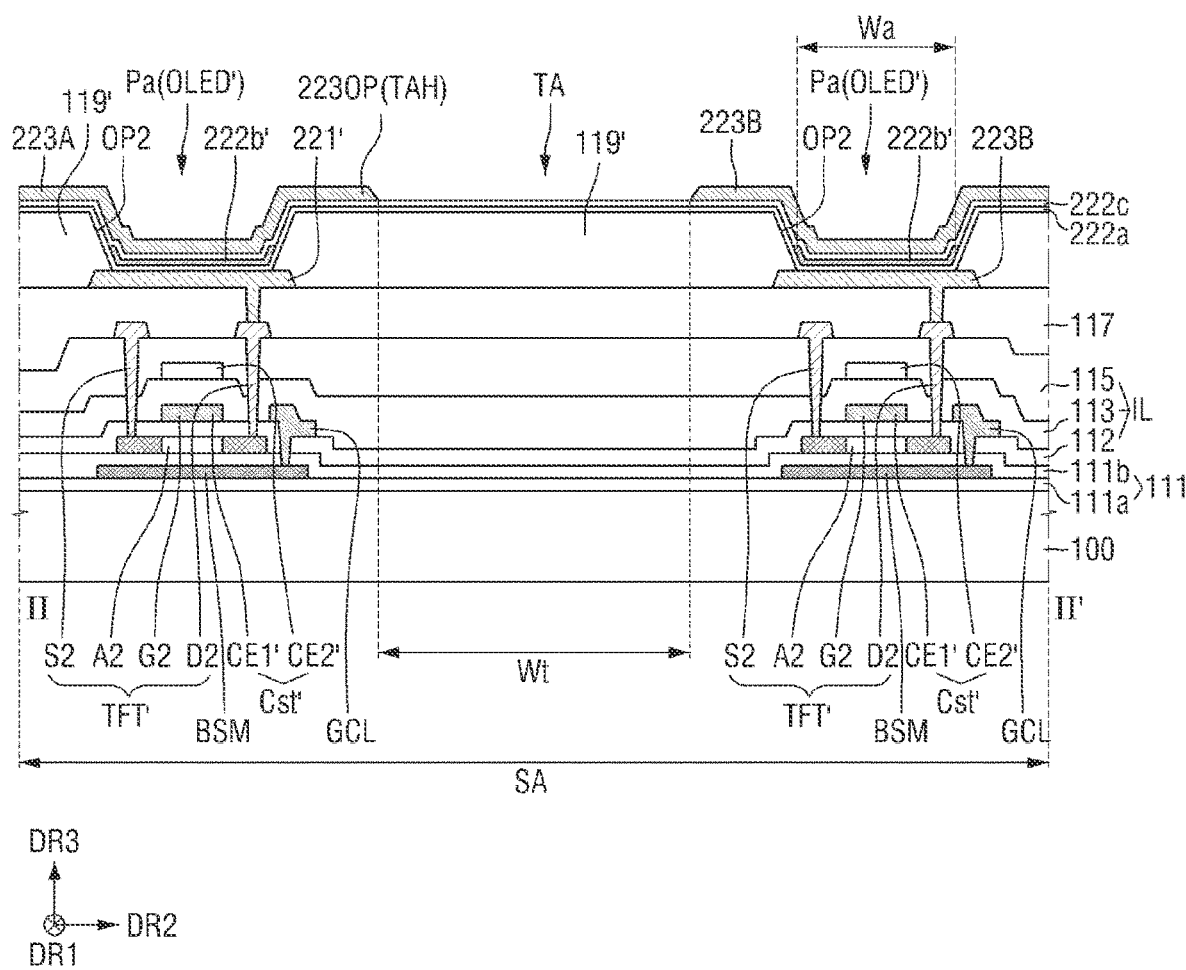

[FIG. 10]
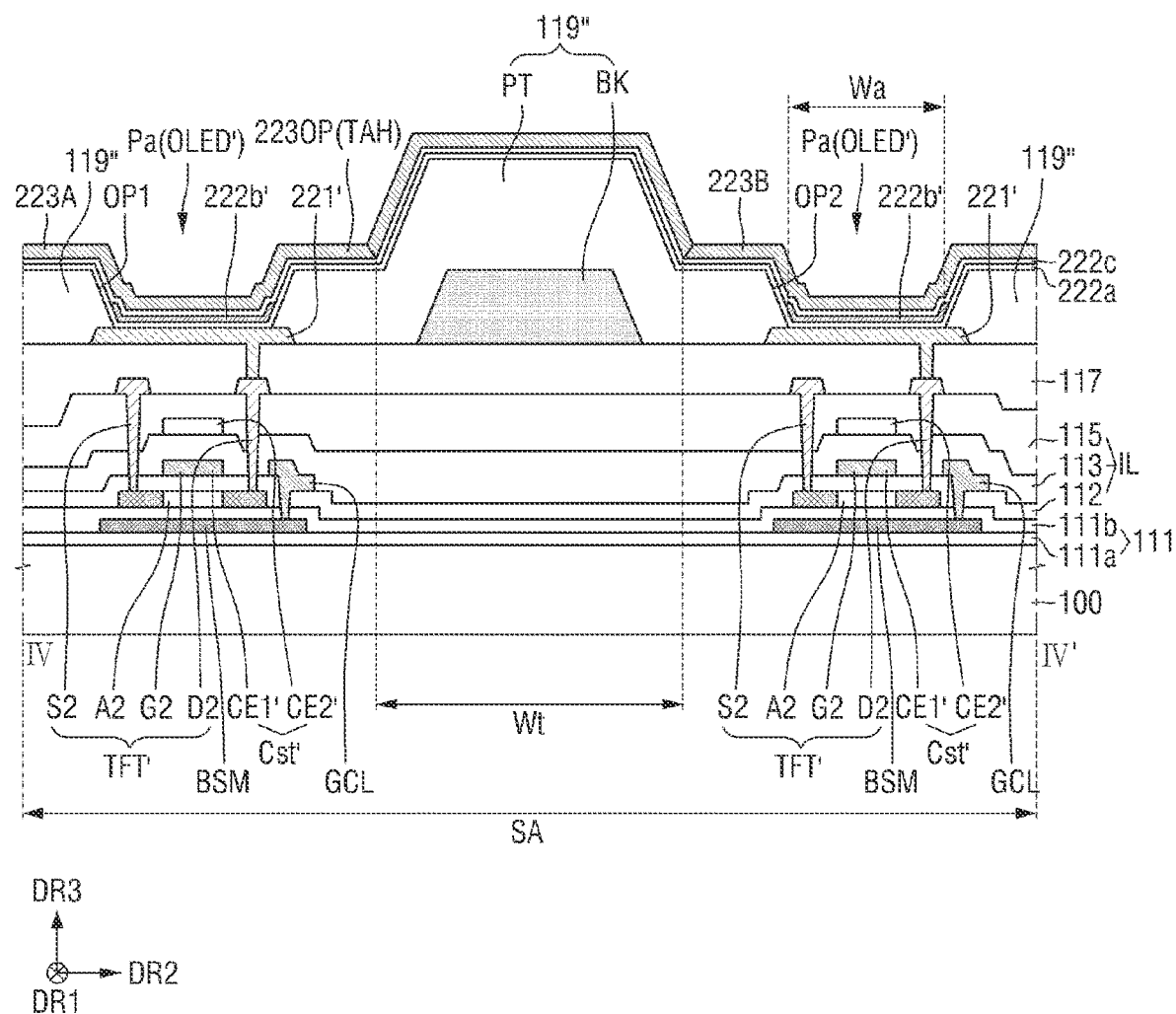

[FIG.11]
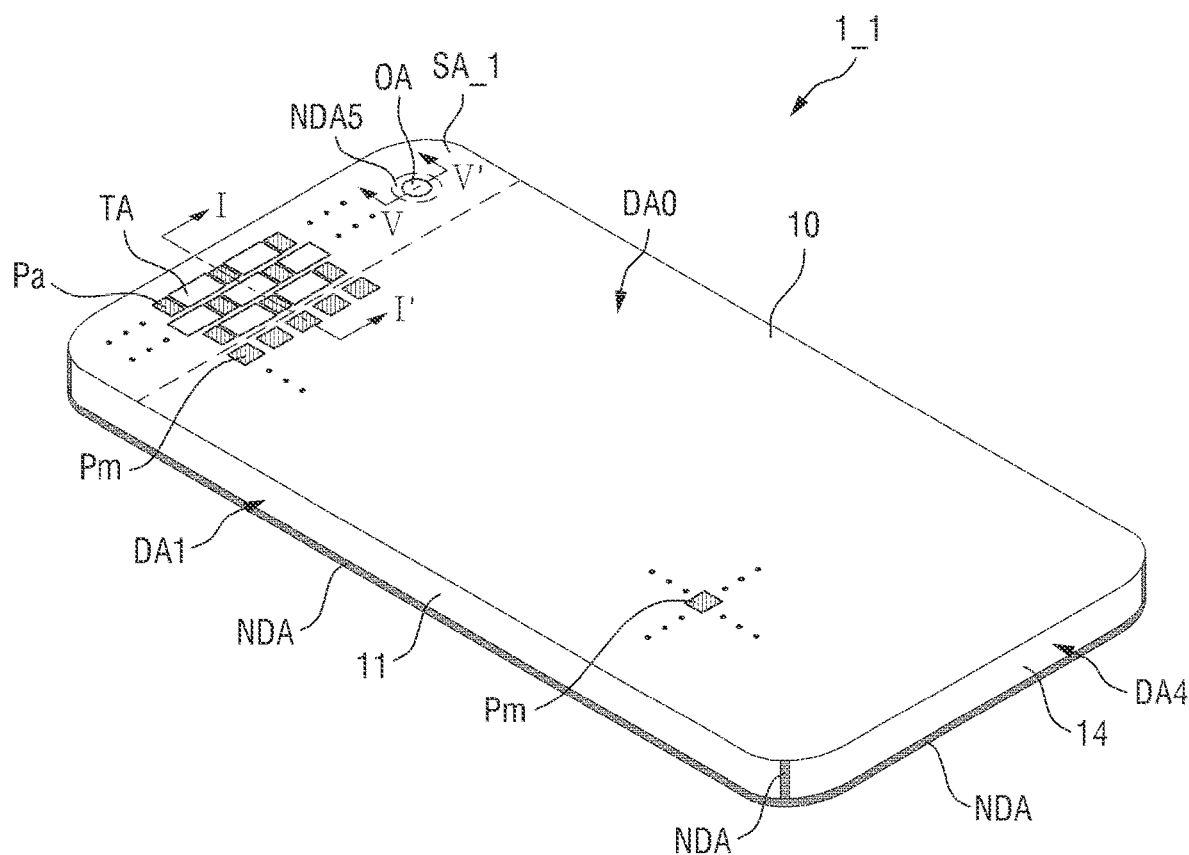

[FIG. 12a]
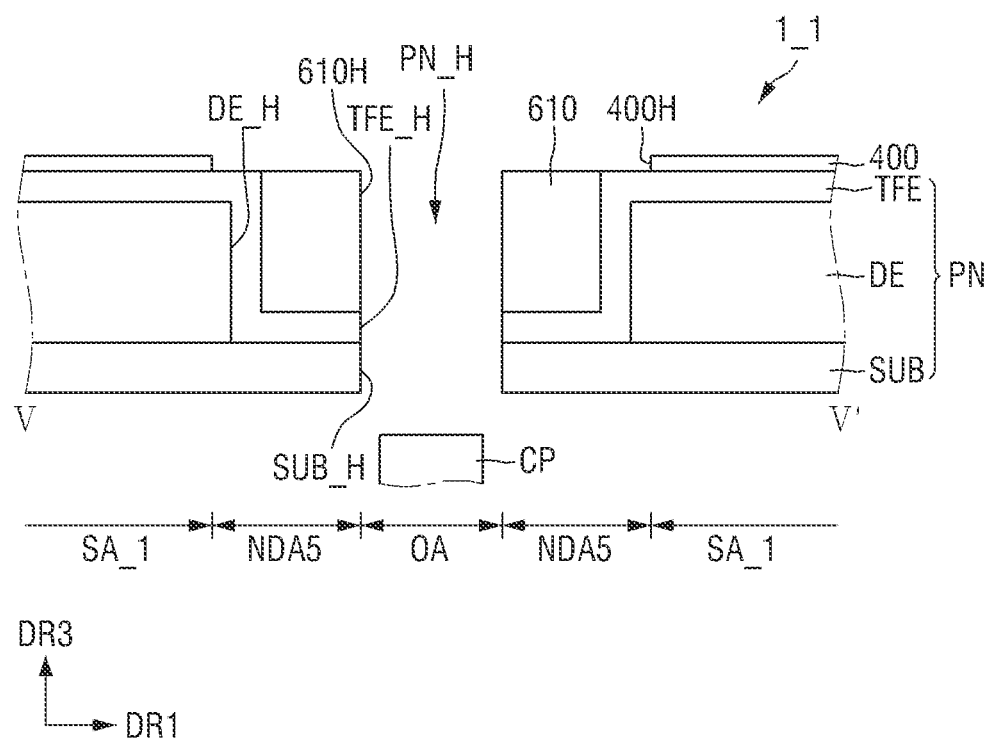

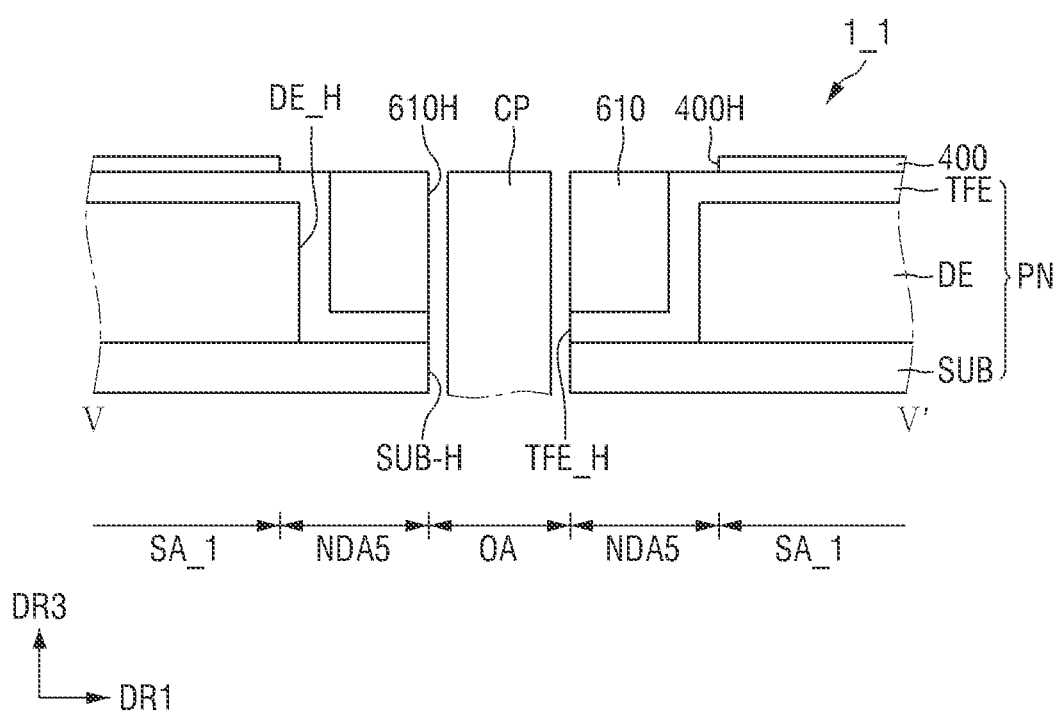
[FIG. 12b]

[FIG. 12c]
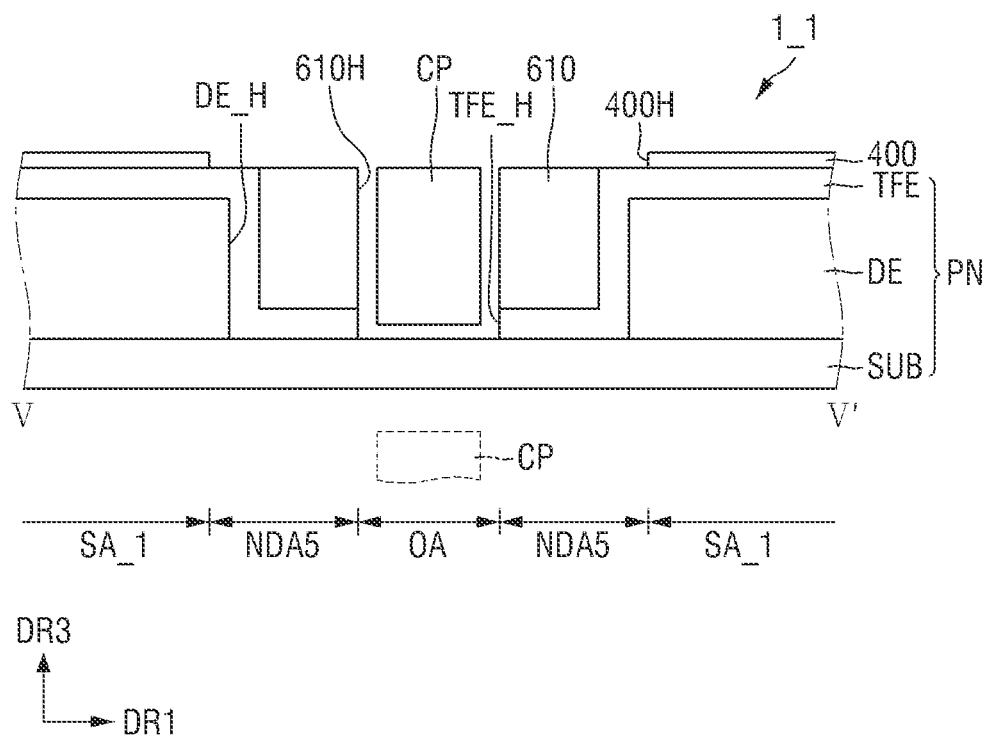

[FIG. 13]
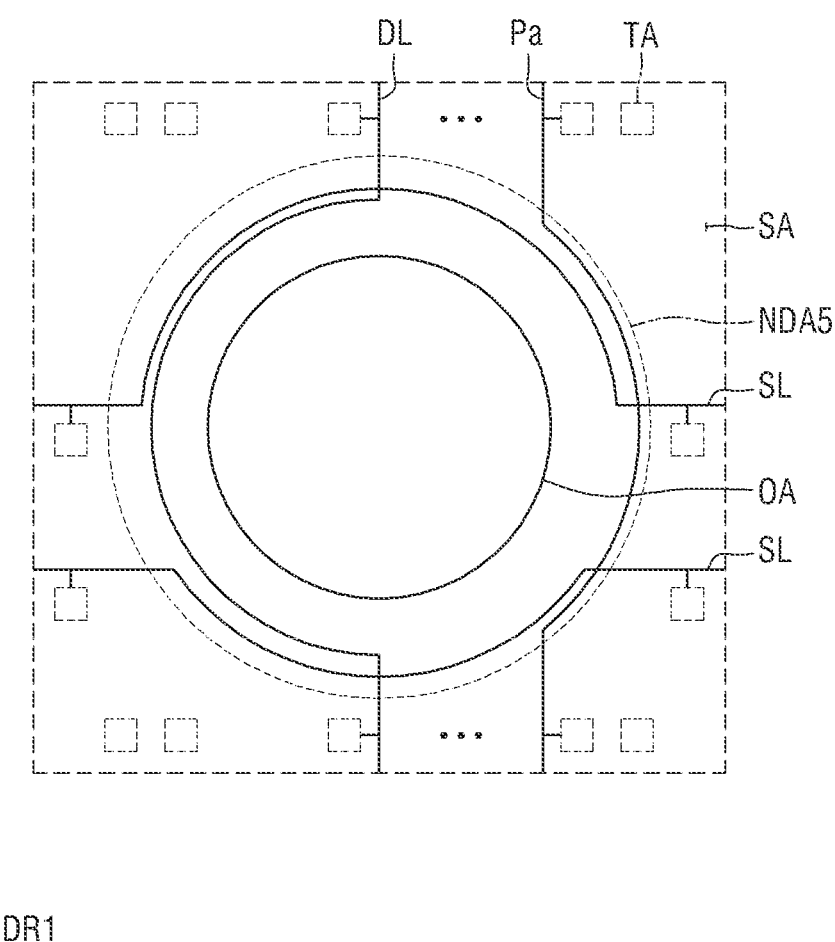

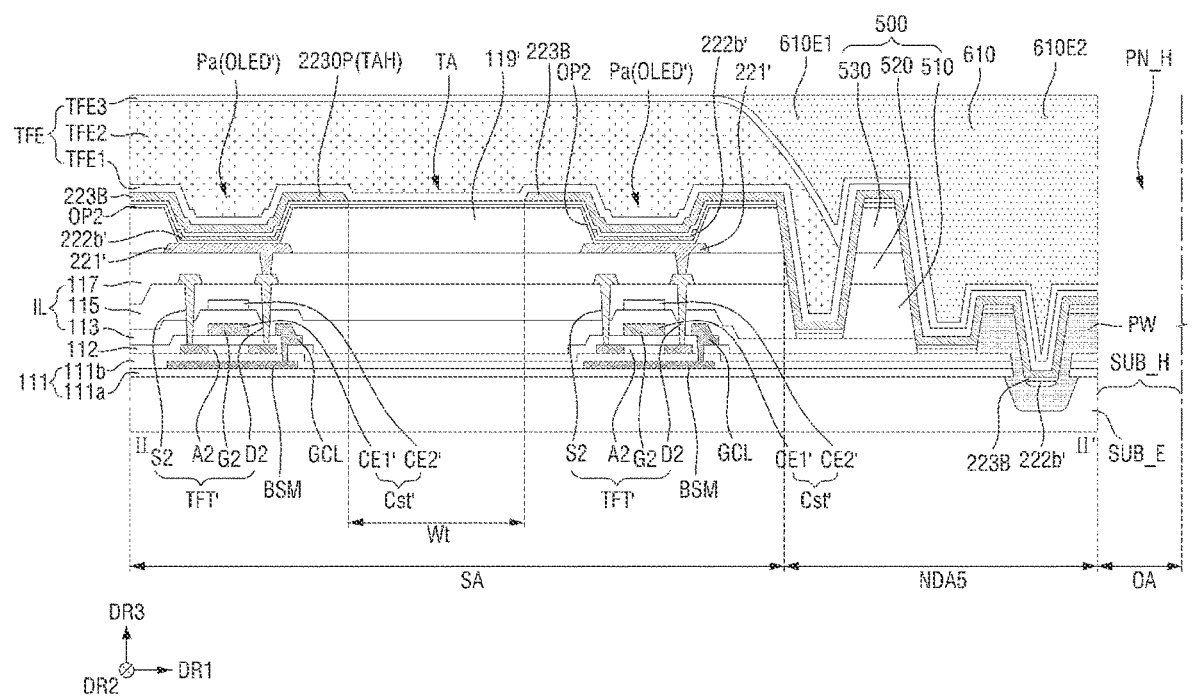
[FIG. 14]

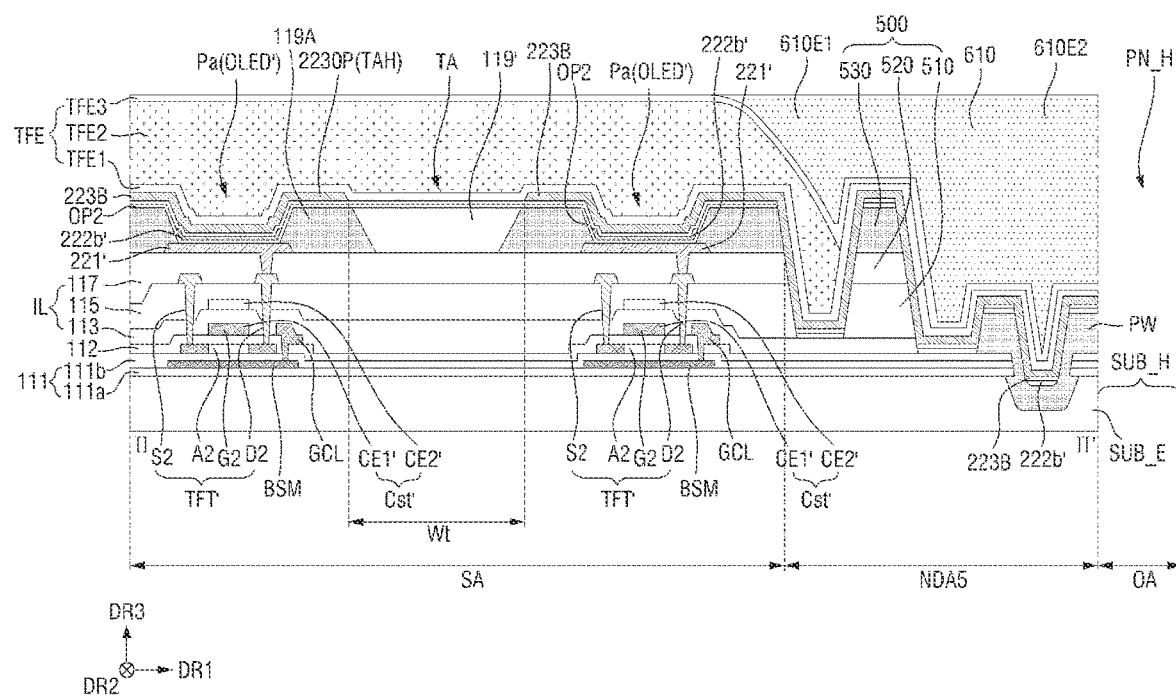
[FIG. 15]

[FIG. 16]
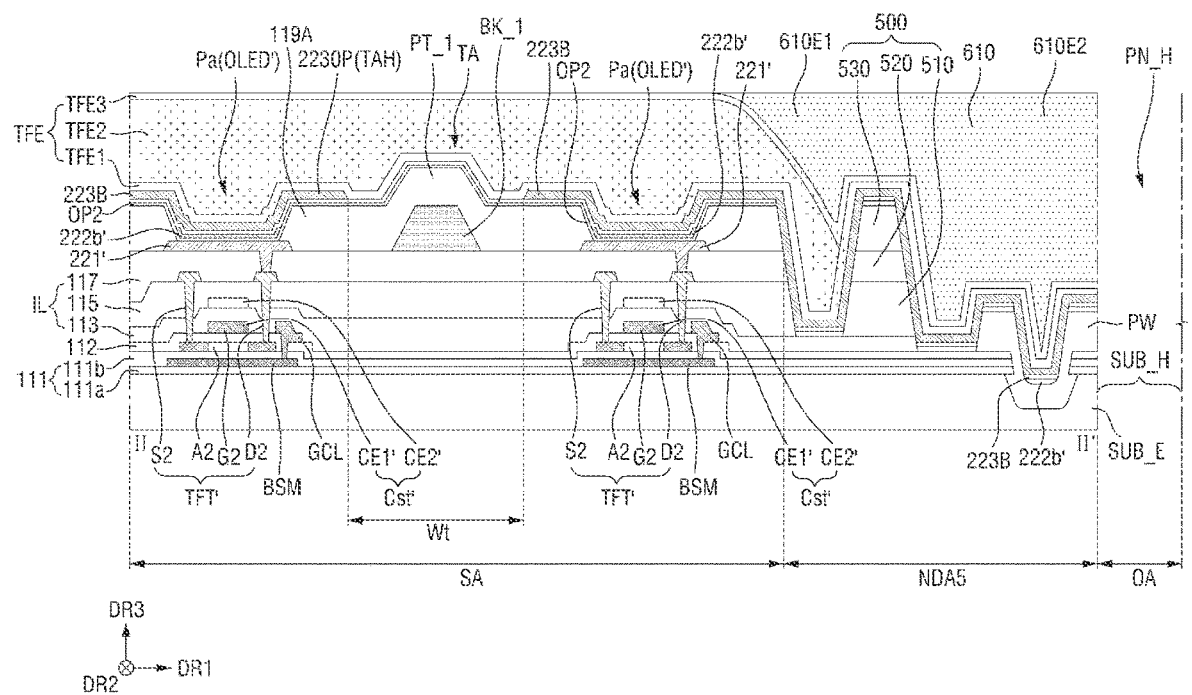

DISPLAY DEVICE

CROSS-REFERENCE TO RELATED APPLICATIONS

The present application is a U.S. National Phase Patent Application of International Patent Application Number PCT/KR2019/016502, filed on Nov. 27, 2019, which claims priority to Korean Patent Application Number 10-2019-0094488, filed on Aug. 2, 2019, the entire content of each of which is incorporated herein by reference.

FIELD

Aspects of some embodiments of the present disclosure relate to a display device.

BACKGROUND

A display device is a device for displaying images, and includes a display panel such as a light emitting display panel or a liquid crystal display panel, which includes an organic light emitting diode (OLED) or a quantum dot electroluminescence device (OD-EL).

The display device generally includes a pixel circuit and a driving unit for driving the pixel circuit. The driving unit may be located in a non-display area adjacent to a display area, and the non-display area may be considered as a type of dead space in view of a function of the display device. In order to reduce the area of the dead space, the display device may include a connection line for transferring a data signal to a signal line in the display area. However, because a pattern may be visible due to a difference in length and area between connection lines, a black pixel defining layer may be used to prevent the pattern from being visible.

Recently, a display device in which sensors are below a display panel includes a pixel area for displaying images and a sensor area having a transmission area in which a sensor or the like may be arranged. However, a problem may occur in that transmittance of the sensor area may be reduced when the black pixel defining layer is used in the display device.

The above information disclosed in this Background section is only for enhancement of understanding of the background and therefore the information discussed in this Background section does not necessarily constitute prior art.

SUMMARY

Aspects of some embodiments of the present disclosure include a display device in which sensors are arranged below a display panel and pixel defining layers of a pixel area and a sensor area are formed of their respective materials different from each other to prevent or reduce visibility of a signal line pattern and to improve transmittance of the sensor area.

The characteristics of embodiments according to the present disclosure are not limited to those mentioned above, and additional characteristics of embodiments according to the present disclosure, which are not mentioned herein, will be clearly understood by those skilled in the art from the following description of the present disclosure.

A display device according to some embodiments of the present disclosure includes a substrate including a display area including main pixels and a sensor area including auxiliary pixels and transmission areas, first anode electrodes arranged to correspond to the main pixels, first pixel defining layers defining an opening that partially exposes the first anode electrodes, spacers arranged on the first pixel defining layers and protruded in a thickness direction, second anode electrodes arranged to correspond to the auxiliary pixels, and second pixel defining layers defining an opening that partially exposes the second anode electrodes. The spacers and the second pixel defining layers are simultaneously formed of the same material.

According to some embodiments, the first pixel defining layers may include carbon black and an organic insulating material.

According to some embodiments, the second pixel defining layers and the spacers may include at least one transparent organic material selected from polyimide, polyamide, acrylic resin, or phenol resin.

According to some embodiments, the display device may comprise a component located below the transmission area, wherein the component may include at least one of infrared, visible or acoustic sensors.

According to some embodiments, a size of one transmission area may be larger than that of one light emission area of the auxiliary pixels.

According to some embodiments, the number per unit area of the auxiliary pixels may be less than the number per unit area of the main pixels.

A display device according to some embodiments of the present disclosure includes a substrate including a display area including main pixels and a sensor area including auxiliary pixels and transmission areas, first anode electrodes arranged to correspond to the main pixels, first pixel defining layers defining an opening that partially exposes the first anode electrodes, spacers on the first pixel defining layers and protruded in a thickness direction, second anode electrodes corresponding to the auxiliary pixels, and second pixel defining layers defining an opening that partially exposes the second anode electrodes. The second pixel defining layers include bank portions and protrusion portions that cover the bank portions and are protruded in a thickness direction. The first pixel defining layers and the bank portions may simultaneously be formed of the same material.

According to some embodiments, the first pixel defining layers and the bank portions may include carbon black and an organic insulating material.

According to some embodiments, the protrusion portions and the spacers may include at least one transparent organic material selected from polyimide, polyamide, acrylic resin, or phenol resin.

According to some embodiments, a height from the substrate to an upper surface of the protrusion portions may be equal to a height from the substrate to an upper surface of the spacers.

According to some embodiments, the display device may comprise a component located below the transmission area, wherein the component may include at least one of infrared, visible or acoustic sensors.

According to some embodiments, a size of one transmission area may be larger than that of one light emission area of the auxiliary pixels.

According to some embodiments, the number per unit area of the auxiliary pixels may be less than the number per unit area of the main pixels.

A display device according to some embodiments of the present disclosure includes a substrate including a display area including main pixels, a sensor area including auxiliary pixels and transmission areas, and an opening area formed in the sensor area, and including a non-display area between the sensor area and the opening area, first anode electrodes corresponding to the main pixels, first pixel defining layers defining an opening that partially exposes the first anode electrodes, first spacers arranged on the first pixel defining layers, second anode electrodes corresponding to the auxiliary pixels, and second pixel defining layers defining an opening that partially exposes the second anode electrodes. The display device includes a light leakage prevention wall in the non-display area and formed along the opening area. The first pixel defining layers and the light leakage prevention wall are simultaneously formed of the same material.

According to some embodiments, the first pixel defining layers and the light leakage prevention wall may include carbon black and an organic insulating material.

According to some embodiments, the second pixel defining layers and the spacers may include at least one transparent organic material selected from polyimide, polyamide, acrylic resin, or phenol resin.

According to some embodiments, the display device may comprise a component below the transmission area, wherein the component may include at least one of infrared, visible or acoustic sensors.

According to some embodiments, a size of one transmission area may be larger than that of one light emission area of the auxiliary pixels.

According to some embodiments, the number per unit area of the auxiliary pixels may be less than the number per unit area of the main pixels.

According to some embodiments, the display device may comprise a thin film encapsulation layer that covers the display area and the sensor area, wherein the thin film encapsulation layer may include a first inorganic encapsulation layer, an organic encapsulation layer, and a second inorganic encapsulation layer, which are sequentially deposited.

According to some embodiments of the present disclosure, in a display device in which sensors are below a display panel, pixel defining layers of a pixel area and a sensor area may be formed of their respective materials different from each other to prevent or reduce visibility of a signal line pattern and to improve transmittance of the sensor area.

The characteristics of embodiments of the present disclosure are not limited to those mentioned above, and more various effects are included in the following description of the present disclosure.

BRIEF DESCRIPTION OF THE DRAWINGS

FIG. 1 is a perspective view illustrating a display device according to some embodiments.

FIG. 2 is a schematic sectional view illustrating a display device according to some embodiments.

FIG. 3 is an exploded view illustrating that the display device of FIG. 1 is unfolded.

FIG. 4 is a plane view illustrating an example of the display device of FIG. 1.

FIG. 5 is an equivalent circuit view illustrating a pixel capable of being located in a display area of a display device according to some embodiments and performing active matrix driving.

FIG. 6 is an equivalent circuit view illustrating a pixel capable of being located in a display area of a display device according to some embodiments and performing active matrix driving.

FIG. 7 is a schematic plane view corresponding to an area A of FIG. 3 and partially illustrating a boundary portion between a display area and a sensor area.

FIG. 8 is a schematic sectional view taken along the line I-I' of FIG. 7.

FIG. 9 is a schematic sectional view taken along the lines II-II' and III-III' of FIG. 7.

FIG. 10 is a schematic sectional view taken along the line IV-IV' of FIG. 7.

FIG. 11 is a perspective view illustrating a display device according to some embodiments.

FIGS. 12A to 12C are schematic sectional views illustrating a display device according to some embodiments.

FIG. 13 is a plane view illustrating lines (signal lines) positioned in one area of a display panel according to some embodiments.

FIGS. 14 to 16 are cross-sectional views illustrating a display device according to some embodiments.

DETAILED DESCRIPTION

Characteristics and features of some embodiments of the present disclosure, and implementation methods thereof will be clarified through the following embodiments described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

A case in which an element or a layer is "on" another element or layer includes all cases in which not only the element or layer is directly on another element or layer but also another element or layer is interposed between the element or layer and the other element or layer.

The same reference numerals will be used throughout the disclosure to refer to the same or like parts.

Reference will now be made to the embodiments of the present disclosure with reference to the drawings.

FIG. 1 is a perspective view of a display device according to some embodiments. FIG. 3 is an exploded view illustrating that the display device of FIG. 1 is unfolded.

Referring to FIGS. 1 and 2, a display device 1 may display an image. For example, the display device 1 may include an organic light emitting display (BLED) device, a liquid crystal display (LCD) device, a plasma display panel (PDP) device, a field emission display (FED) device, an electrophoretic display (EPD) device, or the like. Although the following description describes display device 1 as an organic light emitting display device for the purpose of illustration, embodiments according to the present disclosure are not limited thereto.

The display device 1 may be applied to various products such as televisions, laptop computers, monitors, advertising boards, and Internet of Things devices as well as portable electronic devices such as a mobile phone, a smart phone, a tablet (personal computer) PC, a smart watch, a watch phone, a mobile communication terminal, an electronic diary, an electronic book, a portable multimedia player (PMP), a navigator, and an ultra-mobile PC (UMPC).

The display device 1 may include a main display surface 10 and sub-display surfaces 11, 12, 13 and 14.

The main display surface 10 generally has a plate shape, is positioned on one plane of the display device 1, and may have the widest area (or size) of the main display surface 10 and the sub-display surfaces 11, 12, 13 and 14. For example, the main display surface 10 may be positioned on an upper surface of the display device 1. The main display surface 10 may have a polygonal shape such as a rectangle or a planar shape such as a circle, and an ellipse.

The sub-display surfaces 11, 12, 13 and 14 may be positioned on a plane different from the plane on which the main display surface 10 is positioned. Each of the sub-display surfaces 11, 12, 13 and 14 has an area smaller than that of the main display surface 10, and the sub-display surfaces 11, 12, 13 and 14 may be positioned on their respective planes different from one another. The sub-display surfaces 11, 12, 13 and 14 may be connected with sides of the main display surface 10, respectively, and may be bent or curved from the main display surface 10 (or sides of the main display surface 10).

For example, when the main display surface 10 has a rectangular shape, the display device 1 may include first to fourth sub-display surfaces 11, 12, 13 and 14, and the first to fourth sub-display surfaces 11, 12, 13 and 14 may respectively be connected to four sides of a rectangle.

The first sub-display surface 11 may be connected to a first long side of the main display surface 10 and bent from the main display surface 10 in a vertical direction to constitute a left side of the display device 1. Similarly, the second sub-display surface 12 may be connected to a second long side of the main display surface 10 and bent from the main display surface 10 in the vertical direction to constitute a right side of the display device 1. The third sub-display surface 13 may be connected to a first short side of the main display surface 10 to constitute an upper surface of the display device 1, and the fourth sub-display surface 14 may be connected to a second short side of the main display surface 10 to constitute a lower surface of the display device 1.

In this case, the display device 1 may be a multi-sided stereoscopic display device that displays a screen on an upper surface and sides connected to the upper surface. Although FIG. 2 shows that the lower surface of the display device 1 does not include a display surface, this is only an example, and embodiments according to the present disclosure are not limited thereto. For example, the display device 1 may further include a lower surface for displaying an image.

The main display surface 10 may include a main display area DA0 including main pixels Pm, and a sensor area SA including auxiliary pixels Pa and transmission areas TA.

A main image may be provided using light emitted from a plurality of main pixels Pm located in the main display area DA0.

The display device 1 includes a sensor area SA. The sensor area SA may be an area, in which a component, such as a sensor that uses an infrared ray, a visible ray or a sound, is located, at a lower portion thereof. The sensor area SA may include a transmission area TA through which light and/or sound output from the component to the outside or moving from the outside toward the component may be transmitted.

The auxiliary pixels Pa may be arranged, and an image (e.g., a set or predetermined image) may be provided using light emitted from the plurality of auxiliary pixels Pa. The image provided by the sensor area SA is an auxiliary image, and may have resolution lower than that of an image provided by the main display area DA0. That is, the sensor area SA includes a transmission area TA through which light and/or sound may be transmitted, and the number of auxiliary pixels Pa, which may be arranged per unit area, may be less than the number of main pixels Pm arranged per unit area in the main display area DA0.

The sensor area SA may be located at one side of the main display area DA0, and according to some embodiments, the sensor area SA may be located at an upper side of the main display area DA0.

The display device 1 may include a display area DA and a non-display area NDA. The display area is an area for displaying an image, and may include a pixel PX that is a light emitting unit of a minimum unit for displaying an image. The non-display area is an area for not displaying an image, and may not include a pixel PX. The pixel PX will be described later with reference to FIGS. 5 and 6.

First, the display area DA may include a main display area DA0 and first to fourth sub-display areas DA1 to DA4.

The main display area DA0 may be positioned on the main display surface 10. For example, the main display surface 10 may include only the main display area DA0. The first display area DA1 may be positioned on the first sub-display surface 11, and the first display area DA1 may be connected with the main display area DA0. Similarly, the second to fourth display areas DA2 to DA4 may be positioned on the second to fourth sub-display surfaces 12 to 14, respectively, and each of the second to fourth display areas DA2 to DA4 may be connected with the main display area DA0.

The non-display area NDA may be arranged along an edge (or the outermost edge of the main display surface 10 and the sub-display surfaces 11, 12, 13 and 14) of the display area DA on the exploded view of the display device 1. A driving line, a driving circuit, and the like may be located at the non-display area NDA. The non-display area NDA may include, but is not limited to, a black matrix, a decoration ink, and the like, which shield leakage light.

The non-display area NDA may include first to fourth non-display areas NDA1 to NDA4 (or first to fourth sub non-display areas). The first non-display area NDA1 may be positioned on the first sub-display surface 11. Similarly, the second to fourth non-display areas NDA2 to NDA4 may be positioned on the second to fourth sub-display surfaces 12 to 14, respectively.

In the embodiments, the non-display area (NDA) (or display device 1) may include first to fourth corner wings 21 to 24 (or corner portions, corner areas, corner wing areas). Each of the first to fourth corner wings 21 to 24 may be a to be adjacent to a corner (i.e., portion where two sides meet) of the main display surface 10. The first to fourth corner wings 21 to 24 may substantially be the same as one another except for their positions. Hereinafter, common features of the first to fourth corner wings 21 to 24 will be described based on the first corner wing 21, and their repeated description will be omitted.

The first corner wing 21 may have a shape protruded from the corner of the main display surface 10 toward the outside. The first corner wing 21 may be positioned between the first sub-display surface 11 and the fourth sub-display surface 14 (or may be positioned between the first sub-display area DA1 and the fourth sub-display area DA4 or between the first non-display area NDA1 and the fourth non-display area NDA4), or may mitigate an intersection angle between the first sub-display surface 11 and the fourth sub-display surface 14. One end of the first corner wing 21 may be positioned on the first sub-display surface 11 and the other end thereof may be positioned on the fourth sub-display surface 14.

The first corner wing 21 may provide a space on which signal lines are located or a space through which the signal lines pass. When the first sub-display surface 11 and the fourth sub-display surface 14 are bent, the first corner wing 21 may be folded inward (i.e., toward an inner space or center of gravity of the display device 1). In this case, the first corner wing 21 may be bent along a bending line 20 so that one end (i.e., a first portion adjacent to the first sub-display surface 11) of the first corner wing 21 and the other end (i.e., a second portion adjacent to the fourth sub-display surface 14) of the first corner wing 21 may face each other. One end and the other end of the first corner wing 21 may be in contact with each other, or may be coupled to each other through a coupling layer or the like.

Because the first corner wing 21 is folded inward upon bending of the first sub-display surface 11 and the fourth sub-display surface 14, the first corner wing 21 may not be exposed to the outside, and similarly, the second corner wing 22, the third corner wing 23, and the fourth corner wing 24 may not be exposed to the outside. Therefore, the first to fourth corner wings 21 to 24 may be included in the non-display area NDA.

The non-display area NDA (or display device 1) may further include a driving area 30, and the driving area 30 may be connected with at least one of the first to fourth sub-display surfaces 11, 12, 13 or 14. For example, the driving area 30 may be connected to one side of the fourth sub-display surface 14 (e.g., lower side of the fourth sub-display surface 14 on the exploded view of the display device 1).

As shown in FIG. 1, when the fourth sub-display surface 14 is vertically bent with respect to the main display surface 10, the driving area 30 may vertically be bent once more with respect to the fourth sub-display surface 14 (i.e., bent at an angle of 180° with respect to the main display surface 10), and may be located below the main display surface 1 in a thickness direction of the main display surface 10. The driving area 30 may overlap the main display surface 10, and may be parallel with the main display surface 10.

The display device 1 may include a driving chip 40 (or a pad portion provided with a driving chip located thereon and electrically connected with the driving chip), and the driving chip 40 may be located in the driving area 30. The driving chip 40 may generate a driving signal required for driving of the pixel PX to provide the driving signal to the display area DA (or pixel PX). For example, the driving chip 40 may generate a data signal for determining light emission luminance of the pixel PX. In this case, the driving chip 40 may provide the data signal to the pixel PX through a driving line formed in the driving area and a signal line (e.g., data line) formed on the main display surface 10 and the sub-display surfaces 11, 12, 13 and 14.

FIG. 3 is a plan view illustrating an example of the display device of FIG. 1.

Referring to FIGS. 1 to 3, the display device 1 may include a signal line 136, a connection line 146, and a driving line 60. The signal line 136, the connection line 146, and the driving line 60 may be located to be extended in a first direction W1 and to be symmetrical with one another based on a reference axis passing through the center of the area of the display device 1. Hereinafter, the description will be based on the signal line 136, the connection line 146, and the driving line 60, which are relatively adjacent to the first sub-display surface 11.

The signal line 136 may include data lines D1 to Dm (or signal lines) (m is an integer equal to or greater than 3).

The data lines D1 to Dm may be extended in the first direction W1, and may be sequentially be arranged with a specific interval along a second direction W2. Each of the data lines D1 to Dm may be extended across the display area DA in the first direction W1. In FIG. 3, the data lines D1 to Dm are extended from the main display area DA0 and the sensor area SA in a straight line along the first direction W1, but the data lines D1 to Dm may be extended from the sensor area SA to bypass the transmission area TA. In this case, the first to k-th data lines among the data lines D1 to Dm may be located only on one display surface (where k is a positive integer equal to or greater than 2 and smaller than m). Hereinafter, the description will be based on that k is 7 and m is greater than 14.

For example, the first to seventh data lines D1 to D7 may be extended from one end of the first non-display area NDA1 to the other end of the first non-display area NDA1 (e.g., from the lower side to the upper side) across the fourth display area DA4. The eighth to fourteenth data lines D8 to D14 may be extended from the fourth non-display area NDA4 to the third non-display area NDA3 across the fourth sub-display area DA4, the main display area DA0, and the third sub-display area DA3. Further, some of the data lines D1 to Dm may be extended from one of the corner wings 21 to 24 to the other one. For example, the third to seventh data lines D3 to D7 may be extended from the first corner wing 21 to the third corner wing 23.

The connection line 146 may electrically connect a portion of the signal line 136 with a portion of the driving line 60. The connection line 146 may be located on a layer different from the layer on which the signal line 136 is located, and the connection line 146 may be insulated from the signal line 136 through an insulating layer.

The connection line 146 may include first to k-th data connection lines DM1 to DMk (or first to k-th connection lines) to correspond to the first to k-th data lines D1 to Dk. When k is 7, the connection line 146 may include first to seventh data connection lines DM1 to DM7. The data connection lines DM1 to DM7 may correspond to the data lines D1 to D7 located on the first sub-display surface 11, respectively.

The first to seventh data connection lines DM1 to DM7 may be extended from the fourth non-display area NDA4 (e.g., the lower side of the fourth non-display area NDA4) of the fourth sub-display surface 14 to one end (e.g., to the lower side of the first non-display area NDA1 of the first sub-display surface 11 and the first corner wing 21) of the corresponding signal line 136 via the display area DA. The first to seventh data connection lines DM1 to DM7 may be spaced apart from one another at a specific interval. The interval among the first to seventh data connection lines DM1 to DM7 may be equal to that among the first to seventh data lines D1 to D7.

FIG. 4 is a schematic cross-sectional view illustrating a display device according to embodiments of the present disclosure, and may correspond to a cross-section taken along the line I-I' of FIG. 1.

Referring to FIG. 4, the display device 1 may include a display panel PN and a component CP. The display panel PN may include a display element layer DE, and the component CP may be arranged to correspond to the sensor area SA.

The display panel PN may include a substrate SUB, a display element layer DE located on the substrate SUB, and a thin film encapsulation layer TFE as a sealing member for sealing the display element layer DE. The display panel PN may further include a lower protective film PF located below the substrate SUB.

The substrate SUB may include a glass or a polymer resin. The polymer resin may include polyethersulfone (PES), polyacrylate (PAR), polyetherimide (PEI), polyethylene n naphthalate (PEN), polyethyleneterephthalate (PET), polyphenylene sulfide (PPS), polyallylate, polyimide (PI), polycarbonate (PC), or cellulose acetate propionate (CAP), and the like. The substrate SUB, which includes a polymer resin, may have a flexible, rollable, or bendable property. The substrate SUB may be a multi-layered structure that includes a layer including the polymer resin and an inorganic layer.

The display element layer DE may include a circuit layer including thin film transistors TFT and TFT', an organic light emitting diode OLED as a display element, and insulating layers IL and IL' between the circuit layer and the organic light emitting diode OLED.

A main pixel Pm including a main thin film transistor TFT and an organic light emitting diode OLED connected with the main thin film transistor TFT may be located in the main display area DA0, and an auxiliary pixel Pa including an auxiliary thin film transistor TFT' and an organic light emitting diode OLED connected with the auxiliary thin film transistor TFT' may be located in the sensor area SA.

The auxiliary thin film transistor TFT' and the transmission area TA on which a display element is not located may be arranged in the sensor area SA. The transmission area TA may be understood as an area where light/signal emitted from the component CP and/or light/signal incident on the component CP is transmitted.

The component CP may be positioned in the sensor area SA. The component CP may be an electronic element that uses light or sound. For example, the component CP may be a sensor for receiving and using light, such as an infrared sensor, a sensor for outputting and sensing light or sound to measure a distance or recognize a fingerprint or the like, a small lamp for outputting light, or a speaker for outputting sound. In case of an electronic element based on light, light of various wavelength bands such as visible light, infrared light, and ultraviolet light may be used. A plurality of components CP may be located in the sensor area SA. For example, a light emitting element and a light receiving element may be provided together in one sensor area SA as the components CP. Alternatively, a light emitting portion and a light receiving portion may simultaneously be provided in one component CP.

A lower metal layer BSM may be located in the sensor area SA. The lower metal layer BSM may be arranged to correspond to a lower portion of the auxiliary thin film transistor TFT'. The lower metal layer BSM may block external light from reaching the auxiliary pixel Pa including the auxiliary thin film transistor TFT' and the like. For example, the lower metal layer BSM may block light emitted from the component CP from reaching the auxiliary pixel Pa.

In some embodiments, a constant voltage or a signal may be applied to the lower metal layer BSM to prevent or reduce damage to the pixel circuit by electrostatic discharge.

The thin film encapsulation layer TFE may include at least one inorganic encapsulation layer and at least one organic encapsulation layer. In this regard, FIG. 4 shows first and second inorganic encapsulation layers TFE1 and TFE3 and an organic encapsulation layer TFE2 between the first and second inorganic encapsulation layers TFE1 and TFE3.

The first and second inorganic encapsulation layers TFE1 and TFE3 may include one or more inorganic insulating materials such as aluminum oxide, titanium oxide, tantalum oxide, hafnium oxide, zinc oxide, silicon oxide, silicon nitride, and silicon oxynitride. The organic encapsulation layer TFE2 may include a polymer-based material. The polymer-based material may include an acrylic resin, an epoxy resin, polyimide, polyethylene, and the like.

The lower protective film PF may be attached to a lower portion of the substrate SUB to support and protect the substrate SUB. The lower protective film PF may include an opening PF_OP corresponding to the sensor area SA. As the lower protective film PF includes the opening PF_OP, light transmittance of the sensor area SA may be improved. The lower protective film PF may include polyethyleneterephthalate (PET) or polyimide (PI).

The size of the sensor area SA may be larger than the area in which the component CP is located. Therefore, the area of the opening PF_OP provided in the lower protective film PF may not be matched with the size of the sensor area SA. For example, the area of the opening PF_OP may be smaller than the size of the sensor area SA.

A plurality of components CP may be located in the sensor area SA. The plurality of components CP may have different functions.

According to some embodiments, components such as an input sensing member for sensing a touch input, an anti-reflection member including a polarizer, a retarder, or a color filter and a black matrix, and a transparent window may further be located on the display panel PN.

Although the thin film encapsulation layer TFE may be used as an encapsulation member for sealing the display element layer DE, embodiments according to the present disclosure are not limited thereto. For example, a sealing substrate bonded to the substrate SUB by a sealant or frit may be used as a sealing member for sealing the display element layer DE.

FIGS. 5 and 6 are equivalent circuit views of a main pixel and/or an auxiliary pixel, which may be included in a display panel according to some embodiments of the present disclosure.

Referring to FIG. 5, each of the pixels Pm and Pa includes a pixel circuit PC connected to a scan line SL and a data line DL, and an organic light emitting diode OLED connected to the pixel circuit PC.

The pixel circuit PC includes a driving thin film transistor T1, a switching thin film transistor T2, and a storage capacitor Cst. The switching thin film transistor T2 is connected to the scan line SL and the data line DL, and transfers the data signal Dm input through the data line DL to the driving thin film transistor T1 in accordance with the scan signal Sn input through the scan line SL.

The storage capacitor Cst is connected to the switching thin film transistor T2 and a driving voltage line PL, and stores a voltage corresponding to a difference between the voltage transferred from the switching thin film transistor T2 and a first power voltage ELVDD (or driving voltage) supplied to the driving voltage line PL.

The driving thin film transistor T1 may be connected to the driving voltage line PL and the storage capacitor Cst, and may control a driving current flowing from the driving voltage line PL to the organic light emitting diode OLED in response to the voltage value stored in the storage capacitor Cst. The organic light emitting diode OLED may emit light having luminance (e.g., set or predetermined luminance) by the driving current.

Although the pixel circuit PC includes two thin film transistors and one storage capacitor in FIG. 5, the present disclosure is not limited thereto. As shown in FIG. 6, the pixel circuit PC may include seven thin film transistors and one storage capacitor.

Referring to FIG. 6, each of the pixels Pm and Pa includes a pixel circuit PC and an organic light emitting diode OLED connected to the pixel circuit PC. The pixel circuit PC may include a plurality of thin film transistors and a storage capacitor. The thin film transistors and the storage capacitor may be connected to signal lines SL, SL−1, EL and DL, an initialization voltage line VL, and the driving voltage line PL.

Although FIG. 6 shows that each of the pixels Pm and Pa is connected to the signal lines SL, SL−1, EL and DL, the initialization voltage line VL, and the driving voltage line PL, the present disclosure is not limited thereto. According to some embodiments, at least one of the signal lines SL, SL−1, EL or DL, the initialization voltage line VL, and the driving voltage line PL may be shared by adjacent pixels.

The plurality of thin film transistors may include a driving thin film transistor T1, a switching thin film transistor T2, a compensation thin film transistor T3, a first initialization thin film transistor T4, an operation control thin film transistor T5, a light emission control thin film transistor T6, and a second initialization thin film transistor T7.

The signal lines include a scan line for transferring a scan signal Sn, a previous scan line SL−1 for transferring a previous scan signal Sn−1 to the first initialization thin film transistor T4 and the second initialization thin film transistor T7, a light emission control line EL for transferring a light emission control signal En to the operation control thin film transistor T5 and the light emission control thin film transistor T6, and a data line DL crossing the scan line SL and transferring the data signal Dm. The driving voltage line PL transfers the driving voltage ELVDD to the driving thin film transistor T1, and the initialization voltage line VL transfers an initialization voltage Vint for initializing the driving thin film transistor T1 and the pixel electrode.

A driving gate electrode G1 of the driving thin film transistor T1 is connected a first storage capacitor plate Cst1 of the storage capacitor Cst, a driving source electrode S1 of the driving thin film transistor T1 is connected to the lower driving voltage line PL via the operation control thin film transistor T5, and a driving drain electrode D1 of the driving thin film transistor T1 is electrically connected with the pixel electrode of the main organic light emitting diode OLED via the light emission control thin film transistor T6. The driving thin film transistor T1 receives the data signal Dm in accordance with a switching operation of the switching thin film transistor T2 and supplies a driving current IDLED to the main organic light emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source electrode S1 of the driving thin film transistor T1 and at the same time is connected to the lower driving voltage line PL via the operation control thin film transistor T5. The switching thin film transistor T2 is turned on in accordance with the scan signal Sn transferred through the scan line SL to perform a switching operation for transferring the data signal Dm transferred to the data line DL, to the driving source electrode S1 of the driving thin film transistor T1.

A compensation gate electrode G3 of the compensation thin film transistor T3 is connected to the scan line SL, a compensation source electrode S3 of the compensation thin film transistor T3 is connected to the driving drain electrode D1 of the driving thin film transistor T1 and connected with the pixel electrode of the organic light emitting diode OLED via the light emission control thin film transistor T6, and a compensation drain electrode D3 of the compensation thin film transistor T3 is connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 is turned on in accordance with the scan signal Sn transferred through the scan line SL to electrically connect the driving gate electrode G1 of the driving thin film transistor T1 with the driving drain electrode D1, thereby diode-connecting the driving thin film transistor T1.

A first initialization gate electrode G4 of the first initialization thin film transistor T4 is connected to the previous scan line SL−1, a first initialization source electrode S4 of the first initialization thin film transistor T4 is connected to a second initialization drain electrode D7 of the second initialization thin film transistor T7 and the initialization voltage line VL, and a first initialization drain electrode D4 of the first initialization thin film transistor T4 is connected to the first storage capacitor plate Cst1 of the storage capacitor Cst, the compensation drain electrode D3 of the compensation thin film transistor T3, and the driving gate electrode G1 of the driving thin film transistor T1 The first initialization thin film transistor T4 is turned on in accordance with the previous scan signal Sn−1 transferred through the previous scan line SL−1 to transfer the initialization voltage Vint to the driving gate electrode G1 of the driving thin film transistor T1, thereby performing an initialization operation for initializing a voltage of the driving gate electrode G1 of the driving thin film transistor T1.

An operation control gate electrode G5 of the operation control thin film transistor T5 is connected to the light emission control line EL, an operation control source electrode S5 of the operation control thin film transistor T5 is connected with the lower driving voltage line PL, and an operation control drain electrode D5 of the operation control thin film transistor T5 is connected with the driving source electrode S1 of the driving thin film transistor T1 and the switching drain electrode D2 of the switching thin film transistor T2.

A light emission control gate electrode G6 of the light emission control thin film transistor T6 is connected to the light emission control line EL, and a light emission control source electrode 56 of the light emission control thin film transistor T6 is connected the driving drain electrode D1 of the driving thin film transistor T1 and the compensation source electrode S3 of the compensation thin film transistor T3, and a light emission control drain electrode D6 of the light emission control thin film transistor T6 is electrically connected to a second initialization source electrode S7 of the second initialization thin film transistor T7 and the pixel electrode of the organic light emitting diode OLED.

The operation control thin film transistor T5 and the light emission control thin film transistor T6 are simultaneously turned on in accordance with the light emission control signal En transferred through the light emission control line EL, whereby the driving voltage ELVDD is transferred to the main organic light emitting diode OLED to allow the driving current IDLED to flow to the organic light emitting diode OLED.

A second initialization gate electrode G7 of the second initialization thin film transistor T7 is connected to the previous scan line SL−1, a second initialization source electrode S7 of the second initialization thin film transistor T7 is connected to the light emission control drain electrode D6 of the light emission control thin film transistor T6 and the pixel electrode of the main organic light emitting diode OLED, and a second initialization drain electrode D7 of the second initialization thin film transistor T7 is connected to the first initialization source electrode S4 of the first initialization thin film transistor T4 and the initialization voltage line VL. The second initialization thin film transistor T7 is turned on in accordance with the previous scan signal Sn−1 transferred through the previous scan line SL−1 to initialize the pixel electrode of the main organic light emitting diode OLED.

Although FIG. 6 shows that the first initialization thin film transistor T4 and the second initialization thin film transistor T1 are connected to the previous scan line SL−1 the present disclosure is not limited thereto. According to some embodiments, the first initialization thin film transistor T4 may be connected to the previous scan line SL−1 and driven in accordance with the previous scan line SL−1, and the second initialization thin film transistor T7 may be connected to a separate signal line (e.g., subsequent scan line) and driven in accordance with a signal transferred to the signal line.

A second storage capacitor plate Cst2 of the storage capacitor Cst is connected to the driving voltage line PL, and a counter electrode of the organic light emitting diode OLED is connected to a common voltage ELVES. Therefore, the organic light emitting diode OLED may emit light by receiving the driving current IOLED transferred from the driving thin film transistor T1, thereby displaying an image.

Although FIG. 6 shows that the compensation thin film transistor T3 and the first initialization thin film transistor T4 have a dual gate electrode, the compensation thin film transistor T3 and the first initialization thin film transistor T4 may have one gate electrode.

According to some embodiments, the main pixel Pm and the auxiliary pixel Pa may include the same pixel circuit PC, but are not limited thereto. The main pixel Pm and the auxiliary pixel Pa may include their respective pixel circuits PC different from each other. For example, the main pixel Pm may employ the pixel circuit of FIG. 6, and the auxiliary pixel Pa may employ the pixel circuit of FIG. 5. In this way, various modifications may be made in the main pixel Pm and the auxiliary pixel Pa.

Hereinafter, a relation between a first pixel defining layer 119 and a spacer 120, which are located in the main display area DA0, and a second pixel defining layer 119' located in the sensor area SA will be described in detail with reference to FIGS. 7 to 9.

FIG. 7 is a schematic plane view corresponding to an area A of FIG. 3 and partially illustrating a boundary portion between a display area and a sensor area, FIG. 8 is a schematic sectional view taken along the line I-I' of FIG. 7, and FIG. 9 is a schematic sectional view taken along the lines II-II' of FIG. 7.

Referring to FIG. 7, the display device according to some embodiments of the present disclosure includes a main display area DA0 including a plurality of main pixels Pm and a sensor area SA including a plurality of auxiliary pixels Pa and a transmission area TA, and includes a plurality of counter electrodes 223. The counter electrodes 223 include a plurality of first counter electrodes 223A arranged to correspond to the main display area DA0, and a plurality of second counter electrodes 223B arranged to correspond to the sensor area SA, and the first counter electrodes 223A are provided to have a shape different from that of the second counter electrodes 223B. The counter electrodes 223 may be connected to each other.

Each of the first and second counter electrodes 223A and 223B may be arranged to correspond to one pixel group Pg.

At least one of the pixels Pa or Pm may be included in the pixel group Pg. In FIG. 7, one pixel group Pg includes four pixels Pa and Pm arranged in two rows, but the present disclosure is not limited thereto. Various modifications may be made in the number and arrangement of the pixels Pa and Pm included in one pixel group Pg. For example, one pixel group Pg may include three pixels Pa and Pm arranged side by side in a row, or may include eight pixels Pa and Pm arranged in four rows. In the present specification, the pixels Pa and Pm may refer to subpixels that emit red, green, or blue.

The transmission area TA is an area in which light transmittance is high as a display element is not located, and may be provided in the sensor area SA in a plural number. The transmission areas TA may alternately be located with the pixel group Pg along a first direction DR1 and/or a second direction DR2. Otherwise, the transmission areas TA may be arranged to surround the pixel group Pg. Otherwise, the auxiliary pixels Pa may be arranged to surround the transmission areas TA. According to some embodiments, the transmission area TA is an area in which the first and second counter electrodes 223A and 223B are not located, and may mean an area corresponding to an opening 233OP of the counter electrode 233 in the sensor area SA.

The size of the transmission area TA may be larger than a light emission area of at least one pixel Pa or Pm. In some embodiments, the size of the transmission area TA may be equal to or greater than the size of one pixel group Pg.

The first and second counter electrodes 223A and 223B may electrically be connected to each other. A portion of the first counter electrode 223A and the second counter electrode 223B may electrically be connected to each other at a boundary between the main display area DA0 and the sensor area SA, and a plurality of first counter electrodes 223A spaced apart from each other in the second direction may electrically be connected with a second power supply line ELVSS (see FIG. 5 and FIG. 6) of the non-display area NDA.

In detail, the first counter electrodes 223A adjacent to the first direction DR1 among the first counter electrodes 223A may be connected to each other, and the first counter electrodes 223A adjacent to the second direction DR2 may be spaced apart from each other. However, the first counter electrodes 223A spaced apart from each other in the second direction DR2 are electrically connected to the second power supply line ELVSS (see FIGS. 5 and 6) of the non-display area NDA, and consequently, the first counter electrodes 223A may be electrically connected to each other.

The second counter electrodes 223B may be arranged to overlap the pixel group Pg in a third direction DR3 along the first direction DR1 and/or the second direction DR2 by bypassing the transmission area TA. That is, it may be understood that the second counter electrodes 223B arranged along the first direction DR1 are spaced apart from each other with the transmission area TA interposed therebetween, and the second counter electrodes 223B arranged along the second direction DR2 are spaced apart from each other with the transmission area TA interposed therebetween. The second counter electrodes 223B may be arranged to be electrically connected to each other in the first direction DR1 and the second direction DR2. The second counter electrodes 223B connected to each other may electrically be connected to the second power supply line ELVSS (see FIG. 5 and FIG. 6) of the non-display area NDA.

According to some embodiments, a first width W1 may be larger than a second width W2. That is, because the second width W2 in the first direction W2 of the second counter electrode 223B located in the sensor area SA is smaller than the first width W1 in the first direction W2 of the first counter electrode 223A located in the display area DA, a spaced distance between the second counter electrodes 223B located with the transmission area TA interposed therebetween may be larger. That is, a width Wt in the first direction W2 of the transmission area TA is larger than the first width W1, and therefore, the transmission area TA through which light may pass may be provided with a large size (Wt>W1>W2).

Meanwhile, a spaced distance between the first counter electrodes 223A adjacent to each other in the second direction W2 among the first counter electrodes 223A may be provided with a very smaller size than a length dt in the second direction W1 of the transmission area TA.

Hereinafter, a deposited structure of a display device according to some embodiments of the present disclosure will be described with reference to FIGS. 8 and 9. FIG. 8 is a schematic sectional view taken along the line I-I' of FIG. 7 and illustrates a partial section of the display area DA, and FIG. 9 is a schematic sectional view taken along the lines II-II' of FIG. 7 and illustrates a partial section of the sensor area SA.

Referring to FIGS. 8 and 9, the display device according to some embodiments of the present disclosure includes a main display area DA0 and a sensor area SA. A main pixel Pm is located in the main display area DA0, and an auxiliary pixel Pa and a transmission area TA are located in the sensor area.

The main pixel Pm may include a main thin film transistor TFT, a main storage capacitor Cst, and a main organic light emitting diode OLED. The auxiliary pixel Pa may include an auxiliary thin film transistor TFT', an auxiliary storage capacitor Cst', and an auxiliary organic light emitting diode OLED'. The transmission area TA may include a transmission hole TAH to correspond to the transmission area TA.

Hereinafter, a structure in which components included in the display device according to some embodiments of the present disclosure are deposited will be described.

The substrate SUB may include a glass or a polymer resin.

A buffer layer 111 may be positioned on the substrate SUB to reduce or block particles, moisture or external air from being permeated from the lower portion of the substrate SUB, and may provide a flat surface on the substrate SUB. The buffer layer 111 may include an inorganic material such as oxide or nitride, an organic material, or an organic/inorganic composite, and may be formed of a single layer or a multi-layered structure of an inorganic material and an organic material. A barrier layer for blocking permeation of the external air may further be included between the substrate SUB and the buffer layer 111. In some embodiments, the buffer layer 111 may be formed of silicon oxide (SiO2) or silicon nitride (SiNx). The buffer layer 111 may be provided such that a first buffer layer 111a and a second buffer layer 111b are deposited.

In the sensor area SA, a lower electrode layer BSM may be located between the first buffer layer 111a and the second buffer layer 111b. In other embodiments, the lower electrode layer BSM may be located between the substrate SUB and the first buffer layer 111a. The lower electrode layer BSM may be located below the auxiliary thin film transistor TFT' to prevent or reduce degradation of characteristics of the auxiliary thin film transistor TFT' due to light emitted from the component CP or the like.

In addition, the lower electrode layer BSM may be connected with a line GCL located in another layer through a contact hole. The lower electrode layer BSM may be supplied with a constant voltage or a signal from the line GCL. For example, the lower electrode layer BSM may be supplied with a driving voltage ELVDD or a scan signal. As the lower electrode layer BSM is supplied with a constant voltage or a signal, the probability of occurrence of an electrostatic discharge may remarkably be reduced. The lower electrode layer BSM may include aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and/or copper (Cu). The lower electrode layer BSM may be a single layer or a multi-layer of the above-described materials.

A main thin film transistor TFT and an auxiliary thin film transistor TFT' may be located on the buffer layer 111. The main thin film transistor TFT includes a first semiconductor layer A1, a first gate electrode G1, a first source electrode S1, and a first drain electrode D1, and the auxiliary thin film transistor TFT includes a second semiconductor layer A2, a second gate electrode G2, a second source electrode S2, and a second drain electrode D2. The main thin film transistor TFT may be connected with the main organic light emitting diode OLED of the display area DA to drive the main organic light emitting diode OLED. The auxiliary thin film transistor TFT' may be connected with an auxiliary organic light emitting diode OLED' of the sensor area SA to drive the auxiliary organic light emitting diode OLED'.

The first semiconductor layer A1 and the second semiconductor layer A2 may be located on the buffer layer 111, and may include polysilicon. According to some embodiments, the first semiconductor layer A1 and the second semiconductor layer A2 may include amorphous silicon. According to some embodiments, the first semiconductor layer A1 and the second semiconductor layer A2 may include an oxide of at least one material selected from a group that includes indium (In), gallium (Ga), rhenium (Sn), zirconium (Zr), vanadium (V), hafnium (Hf), cadmium (Cd), germanium (Ge), chromium (Cr), titanium (Ti), and zinc (Zn). The first semiconductor layer A1 and the second semiconductor layer A2 may include a channel area, and source and drain areas doped with impurities.

The second semiconductor layer A2 may overlap the lower electrode layer BSM with the second buffer layer 111b interposed therebetween.

A first gate insulating layer 112 may be provided to cover the first semiconductor layer A1 and the second semiconductor layer A2. The first gate insulating layer 112 may include an inorganic insulating material such as silicon oxide (SiO2), silicon nitride (SiNx), silicon oxynitride (SiON), aluminum oxide (Al2O3), titanium oxide (TiO2), tantalum oxide (Ta2O5), hafnium oxide (HfO2), or zinc oxide (ZnO2). The first gate insulating layer 112 may be a single layer or multi-layer including the inorganic insulating material described above.

A first gate electrode G1 and a second gate electrode G2 are located on the first gate insulating layer 112 to overlap the first semiconductor layer A1 and the second semiconductor layer A2, respectively. The first gate electrode G1 and the second gate electrode G2 may include molybdenum (Mo), aluminum (Al), copper (Cu), titanium (Ti), and the like, and may be formed of a single layer or multi-layer. For example, the first gate electrode G1 and the second gate electrode G2 may be a single layer of Mo.

A second gate insulating layer 113 may be provided to cover the first gate electrode G1 and the second gate electrode G2. The second gate insulating layer 113 may include an inorganic insulating material such as silicon oxide (SiO2), silicon nitride (SiNx), silicon oxynitride (SiON), aluminum oxide (Al2O3), titanium oxide (TiO2), tantalum oxide (Ta2O5), hafnium oxide (HfO2), or zinc oxide (ZnO2). The second gate insulating layer 113 may be a single layer or multi-layer including the inorganic insulating material described above.

A first upper electrode CE2 of the main storage capacitor Cst and a second upper electrode CE2' of the auxiliary storage capacitor Cst' may be located on the second gate insulating layer 113.

In the display area DA, the first upper electrode CE2 may overlap the first gate electrode G1 therebelow. The first gate electrode G1 and the first upper electrode CE2, which overlap each other with the second gate insulating layer 113 interposed therebetween, may form a main storage capacitor Cst. That is, the first gate electrode G1 may serve as the first lower electrode CE1 of the main storage capacitor Cst.

In the sensor area SA, the second upper electrode CE2' may overlap the second gate electrode G2 therebelow. The second gate electrode G2 and the second upper electrode CE2', which overlap each other with the second gate insulating layer 113 interposed therebetween, may form an auxiliary storage capacitor Cst'. The first gate electrode G1 may serve as the second lower electrode CE1' of the auxiliary storage capacitor Cst'.

The first upper electrode CE2 and the second upper electrode CE2' may include aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and/or copper (Cu), and may be a single layer or multi-layer of the materials described above.

An interlayer insulating layer 115 may be formed to cover the first upper electrode CE2 and the second upper electrode CE2'. The interlayer insulating layer 115 may include silicon oxide (SiO2), silicon nitride (SiNx), silicon oxynitride (SiON), aluminum oxide (Al2O3), titanium oxide (TiO2), tantalum oxide (Ta2O5), hafnium oxide (HfO2), or zinc oxide (ZnO2).

The source electrodes S1 and 82 and the drain electrodes D1 and D2 may be located on the interlayer insulating layer 115. The source electrodes S1 and 82 and the drain electrodes D1 and D2 may include a conductive material including molybdenum (Mo), aluminum (Al), copper (Cu), titanium (Ti), and the like, and may be formed of a multi-layer or single layer including the above materials. For example, the source electrodes S1 and 82 and the drain electrodes D1 and D2 may have a multi-layered structure of Ti/Al/Ti.

A planarization layer 117 may be arranged to cover the source electrodes S1 and 82 and the drain electrodes D1 and D2. The planarization layer 117 may have a flat upper surface such that a first pixel electrode 221 and a second pixel electrode 221' arranged thereon may be formed to be flat.

The planarization layer 117 may be formed of a single layer or multi-layer made of an organic material or an inorganic material. The planarization layer 117 may include a general polymer such as Benzo Cyclo Butene (BCB), polyimide, hexamethyldisiloxane (HMDSO), polymethylmethacrylate (PMMA), or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof. The planarization layer 117 may include silicon oxide (SiO2), silicon nitride (SiNx), silicon oxynitride (SON), aluminum oxide (Al2O3), titanium oxide (TiO2), tantalum oxide (Ta2O5), hafnium oxide (HfO2), or zinc oxide (ZnO2). After the planarization layer 117 is formed, chemical mechanical polishing may be performed to provide a flat upper surface.

The planarization layer 117 includes an opening that exposes any one of the first source electrode S1 and the first drain electrode D1 of the main thin film transistor TFT, and the first pixel electrode 221 may electrically be connected with the main thin film transistor TFT in contact with the first source electrode S1 or the first drain electrode D1 through the opening.

In addition, the planarization layer 117 includes an opening that exposes any one of the second source electrode S2 and the second drain electrode D2 of the auxiliary thin film transistor TFT', and the second pixel electrode 221' may electrically be connected with the auxiliary thin film transistor TFT' in contact with the second source electrode S2 or the second drain electrode D2 through the opening.

The first pixel electrode 221 and the second pixel electrode 221' may include a conductive oxide such as indium tin oxide (ITO), indium zinc oxide (IZO), zinc oxide (ZnO), indium oxide (In2O3), indium gallium oxide (IGO), indium gallium oxide (IZO), or aluminum zinc oxide (AZO). According to some embodiments, the first pixel electrode 221 and the second pixel electrode 221' may include a reflective layer that includes silver (Ag), magnesium (Mg), aluminum (Al), platinum (Pt), palladium (Pd), gold (Au), nickel (Ni), neodymium (Nd), iridium (Ir), chromium (Cr), or a compound thereof. According to some embodiments, the first pixel electrode 221 and the second pixel electrode 221' may further include a film formed of ITO, IZO, ZnO or In2O3 above/below the aforementioned reflective film. In some embodiments, the first pixel electrode 221 and the second pixel electrode 221' may be formed of a deposited structure of ITO/Ag/ITO.

In the main display area DA0, the first pixel defining layer 119 may cover the edge of each of the first pixel electrodes 221. The first pixel defining layer 119 overlaps each of the first pixel electrodes 221, and includes a first opening OP1 that defines a light emission area of the pixel. The first pixel defining layer 119 may prevent or reduce instances of an arc occurring at the edge of the first pixel electrode 221 by increasing a distance between the edge of the first pixel electrode 221 and the counter electrode 223A above the first pixel electrode 221.

The first pixel defining layer 119 may be a black pixel defining layer (black PDL). That is, the first pixel defining layer 119 may include a black material that does not transmit light. For example, the first pixel defining layer 119 may include carbon black and an organic insulating material.

As shown in FIGS. 2 and 3, a connection line 146 for transferring a data signal to the signal lines 136 located in the display area DA may be provided to reduce the non-display area NDA. However, a pattern may be visible due to a difference in length and area between the connection lines 146. When a black pixel defining layer is used as the first pixel defining layer 119, display quality deterioration due to reflection, diffraction, and scattering of light by the connection line 146 may be minimized.

The first pixel defining layer 119 may include a spacer 120. The spacer 120 may be arranged to be protruded from an upper surface of the first pixel defining layer 119 in a thickness direction. The spacer 120 may have any one shape of a prismoid, a prism, a truncated cone, a cylinder, a hemisphere, and a semi-spheroid.

The spacer 120 may include at least one transparent organic material selected from Benzo Cyclo Butene (BCB), polyimide (PI), polyimide (PA), acrylic resin, or phenol resin.

In the sensor area SA, the second pixel defining layer 119' may cover the edge of each of the second pixel electrodes 221'. The second pixel defining layer 119' overlaps each of the second pixel electrodes 221', and includes a second opening OP2 that defines a light emission area of the pixel. The second pixel defining layer 119' may prevent or reduce instances of an arc occurring at the edge of the second pixel electrode 221' by increasing a distance between the edge of the second pixel electrode 221' and the counter electrode 223B above the second pixel electrode 221'.

However, the second pixel defining layer 119' formed in the sensor area SA may not be a black pixel defining layer (black PDL), unlike the first pixel defining layer 119 formed in the main display area DA0. That is, the second pixel defining layer 119' may be formed of a transparent material as light transmittance of a specific value or more is required.

A transmission area TA in which a display element is not located may be located in the sensor area SA. The transmission area TA may be understood as an area where light/signal emitted from the component CP or light/signal incident on the component CP is transmitted.

The component CP may be an electronic element that uses light or sound. For example, the component CP may be an optical sensor or a camera. In general, in order to utilize an optical sensor as a proximity sensor, light transmittance of about 15% is required, and light transmittance of about 85% is required to recognize the iris or face. In addition, in order to photograph an object with a camera, light transmittance of about 95% is required.

Therefore, the second pixel defining layer 119' may be formed of the same material as that of the spacer 120, which is formed in the main display area DA0, simultaneously with the spacer 120. That is, the second pixel defining layer 119' may include at least one transparent organic material selected from Benzo Cyclo Butene (BCB), polyimide (PI), polyamide (PA), acrylic resin, or phenol resin.

When the second pixel defining layer 119' is formed of the same transparent organic material as that of the spacer 120 formed in the main display area DA0, transmittance of light emitted and incident by the component CP may be obtained at a specific value or more. In addition, when the spacer 120 is formed in the main display area DA0, the second pixel defining layer 119' of the sensor area SA may be formed simultaneously with the spacer 120, whereby a manufacturing process may not be added.

A first functional layer 222a may be located on the pixel electrodes 221 and 221' exposed by the openings OP1 and OP2 of the first and second pixel defining layers 119 and 119'. The first functional layer 222a may be extended to upper surfaces of the first and second pixel defining layers 119 and 119'. The first functional layer 222a may be a single layer or a multi-layer. The first functional layer 222a may be a hole transport layer (HTL) having a single layered structure. Alternatively, the first functional layer 222a may include a hole injection layer (HIL) and a hole transport layer (HTL). The first functional layer 222a may integrally be formed to correspond to the main pixels Pm and the auxiliary pixels Pa, which are included in the display area DA and the sensor area SA.

A first light emitting layer 221b and a second light emitting layer 222b', which are respectively formed to correspond to the first pixel electrode 221 and the second pixel electrode 221', are located on the first functional layer 222a. The first light emitting layer 222b and the second light emitting layer 222b' may include a polymer material or a monomer material, and may emit red, green, blue or white light.

A second functional layer 222c may be formed on the first light emitting layer 222b and the second light emitting layer 222b'. The second functional layer 222c may be a single layer or a multi-layer. The second functional layer 222c may include an electron transport layer (ETL) and/or an electron injection layer (EIL). The second functional layer 222c may integrally be formed to correspond to the main pixels Pm and the auxiliary pixels Pa, which are included in the display area DA and the sensor area SA. The first functional layer 222a and/or the second functional layer 222c may be omitted.

A spacer SPC may be located on the second functional layer 222c. The spacer SPC may be formed of the same material as that of the pixel defining layer 119. That is, the spacer SPC may include at least one organic material selected from Benzo Cyclo Butene (BCB), polyimide (PI), polyamide (PA), acrylic resin, or phenol resin.

A counter electrode 223 is located on the second functional layer 222c. The counter electrode 223 may include a conductive material having a low work function. For example, the counter electrode 223 may include a (semi-)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or their alloy. Alternatively, the counter electrode 223 may further include a layer such as ITO, IZO, ZnO, or In2O3 on the (semi-)transparent layer including the above-mentioned material.

According to some embodiments, the counter electrode 223 includes first counter electrodes 223A located in the main display area DA0 and second counter electrodes 223B located in the sensor area SA, as described above.

Meanwhile, in the sensor area SA, some of the second counter electrodes 223B may be spaced apart from each other with the transmission area TA interposed therebetween. According to some embodiments, at least a portion of the second counter electrode 222B may not be located on the transmission area TA.

When a gap space between the second counter electrodes 223B may be understood as an opening 2230P of the counter electrode 223, and the opening 2230P may be a transmission hole through which light passes. A width Wt of the transmission hole may be larger than that of a light emission area defined by the second opening OP2 of the pixel defining layer 119.

Because the case that the transmission hole TAH is formed means that the member such as the counter electrode 223 is removed in response to the transmission area TA, light transmittance in the transmission area TA may remarkably be increased According to some embodiments, a capping layer may be formed on the counter electrode 223 to improve light extraction efficiency while protecting the counter electrode 223. The capping layer may include LiF. Alternatively, the capping layer may include an inorganic insulating material such as silicon nitride, and/or may include an organic insulating material.

Hereinafter, other embodiments will be described. In the following embodiments, a description of the same elements as those of the previously described embodiments will be omitted or simplified, and the following description will be based on a difference from the previously described embodiments.

FIG. 10 is a schematic sectional view taken along the line IV-IV' of FIG. 7.

Referring to FIGS. 8 and 10, these embodiments are different from the embodiments with respect to FIG. 9 in that at least a portion of the plurality of second pixel defining layers 119' formed in the sensor area SA may further include a bank portion BK and a protrusion portion PT.

For example, according to some embodiments, in the main display area DA0, the first pixel defining layer 119 may cover the edge of each of the first pixel electrodes 221. The first pixel defining layer 119 overlaps each of the first pixel electrodes 221, and includes a first opening OP1 that defines a light emission area of the pixel.

The first pixel defining layer 119 may be a black pixel defining layer (black PDL). That is, the first pixel defining layer 119 may include a black material that does not transmit light. For example, the first pixel defining layer 119 may include carbon black and an organic insulating material.

The first pixel defining layer 119 may include a spacer 121. The spacer 120 may be arranged to protrude from the upper surface of the first pixel defining layer 119 in a thickness direction. The spacer 120 may have any one shape of a prismoid, a prism, a truncated cone, a cylinder, a hemisphere, and a semi-spheroid.

The spacer 120 may include at least one transparent organic material selected from Benzo Cyclo Butene (BCB), polyimide (PI), polyamide (PA), acrylic resin, or phenol resin.

In the sensor area SA, the second pixel defining layer 119' may cover the edge of each of the second pixel electrodes 221'. The second pixel defining layer 119' overlaps each of the second pixel electrodes 221' and includes a second opening OP2 that defines a light emission area of the pixel. In addition, at least a portion of the second pixel defining layer 119' may further include a bank portion BK and a protrusion portion PT.

The bank portion BK may be formed of the same material as that of the first pixel defining layer 119 formed in the main display area DA0. That is, the bank portion BK may include a black material that does not transmit light. For example, the first pixel defining layer 119 may include carbon black and an organic insulating material.

The protrusion portion PT may be arranged to overlap the bank portion BK in the third direction DR3. That is, the protrusion portion PT may be formed to cover an upper surface of the bank portion PK and to be protruded in the third direction DR3. According to some embodiments, a distance from the upper surface of the substrate SUB to an upper surface of the protrusion portion PT may be equal to the distance from the upper surface of the substrate SUB to an upper surface of the spacer 120 formed in the main display area DA0.

The protrusion portion PT of the second pixel defining layer 119' may be formed of the same material as that of the spacer 120 formed in the main display area DA0. That is, the second pixel defining layer 119' may include at least one transparent organic material selected from Benzo Cyclo Butene (BCB), polyimide (PI), polyamide (PA), acrylic resin or phenol resin.

Hereinafter, the embodiments in which the opening area OA is included in the sensor area SA will be described with reference to FIGS. 11 to 16.

FIG. 11 is a perspective view illustrating a display device according to some embodiments. FIGS. 12A to 12C are schematic sectional views illustrating a display device according to some embodiments. FIG. 13 is a plane view illustrating lines (signal lines) positioned in one area of a display panel according to some embodiments. FIGS. 14 to 16 are sectional views illustrating a section near an opening area of a display device according to some embodiments.

Referring to FIG. 11, a display device 1_1 is different from the display device 1 shown in FIG. 1 in that it further includes an opening area OA in a partial area of the sensor area SA.

For example, according to some embodiments, the display device 1_1 includes an opening area OA at least partially surrounded by the sensor area SA. FIG. 11 shows that the opening area OA is fully surrounded by the sensor area SA. The non-display area NDA may further include a fifth non-display area NDA5 surrounding the opening area OA. The fifth non-display area NDA5 may fully surround the opening area OA, and the sensor area SA may fully surround the fifth non-display area NDA5.

FIGS. 12A to 12C are schematic cross-sectional views illustrating a display device 1_1 according to embodiments of the present disclosure, and may correspond to a cross-section taken along the line V-V' of FIG. 11.

Referring to FIG. 12A, the display device 1_1 may include a display panel PN and a component CP corresponding to an opening area OA of the display panel PN.

The display panel PN may include a substrate SUB, a display element layer DE located on the substrate SUB, including display elements, a thin film encapsulation layer TFE as an encapsulation member covering the display element layer DE, and an input sensing layer 400 for sensing a touch input. According to some embodiments, component(s) such as an anti-reflection member including a polarizer, a retarder or a color filter and a black matrix, and a transparent window may further be located on the input sensing layer 400.

The input sensing layer 400 may be located in the display area DA. The input sensing layer 400 may acquire coordinate information based on an external input, for example, a touch event. The input sensing layer 400 may include a sensing electrode (or a touch electrode) and signal lines (trace lines) connected to the sensing electrode.

A process of forming the input sensing layer 400 may be performed continuously after a process of forming the planarization layer 610, which will be described later, or may be performed continuously after a process of forming the thin film encapsulation layer TFE. Therefore, an adhesive member may not be interposed between the input sensing layer 400 and the thin film encapsulation layer TFE.

The planarization layer 610 is located in the fifth non-display area NDA5. The planarization layer 610 includes organic insulating material. The planarization layer 610 may include a photoresist (e.g., negative or positive photoresist), or may include the same material as that of the organic encapsulation layer of the thin film encapsulation layer TFE, or may include the same material as one of insulating layers of the input sensing layer, which will be described later, or may include other various kinds of organic insulating materials.

As shown in FIG. 12a, the display panel PN may include an opening PN_H that corresponds to the opening area OA and passes through the display panel PN. The substrate SUB, the display element layer DE, the thin film encapsulation layer TFE, the input sensing layer 400, and the planarization layer 610 may include first to fifth openings SUB_H, DE_H, TFE_H, 400H and 610H corresponding to the opening area OA, respectively.

The first opening SUB_H may be formed to pass through the upper surface and the lower surface of the substrate SUB, the second opening DE_H may be formed to pass from the lowest layer to the uppermost layer of the display element layer DE, the third opening 400H may be formed to pass through the thin film encapsulation layer TFE, the fourth opening 400H may be formed to pass from the lowest layer to the uppermost layer of the input sensing layer 400, and the fifth opening 610H may be formed to pass through the upper surface and the lower surface of the planarization layer 610.

The opening area OA is a position where the component CP is located, and the component CP may be located below the display panel PN to correspond to the opening area OA as shown in FIG. 12a, or may be located in the opening PN_H to overlap a side of the opening PN_H of the display panel PN as shown in FIG. 12b.

The component CP may include an electronic component. For example, the component CP may be an electronic element that uses light or sound. For example, the electronic element may include a sensor for receiving and using light, such as an infrared sensor, a camera for receiving light to photograph an image, a sensor for outputting and sensing light or sound to measure a distance or recognize a fingerprint or the like, a small lamp for outputting light, or a speaker for outputting sound. In case of an electronic element based on light, light of various wavelength bands such as visible light, infrared light, and ultraviolet light may be used. In some embodiments, the opening area OA may be output from the component CP to the outside or may be understood as a transmission area capable of transmitting light and/or sound moving from the outside toward the electronic element.

As shown in FIGS. 12a and 12b, the substrate SUB may include a first opening SUB_H corresponding to the opening area OA. Alternatively, as shown in FIG. 12c, the substrate SUB may not include a first opening SUB_H. The component CP may be located below the display panel PN as shown by dotted lines, or may be located in the opening PN_H of the display panel PN as shown by solid lines. The component CP located below the display panel PN may be an electronic element that uses light.

FIG. 13 is a plan view illustrating a portion of a display panel according to some embodiments, and illustrates lines (e.g., signal lines) positioned in a fifth non-display area.

Referring to FIG. 13, the auxiliary pixels Pa and the transmission area TA may alternately be located in the sensor area TA based on the opening area OA, and the fifth non-display area NDA5 may be positioned between the opening area OA and the sensor area SA.

The auxiliary pixels Pa may be spaced apart from each other based on the opening area OA. The auxiliary pixels Pa may be spaced apart from each other up and down based on the opening area OA, or may be spaced apart from each other from left to right based on the opening area OA.

The signal lines adjacent to the opening area OA among the signal lines supplying signals to the auxiliary pixels Pa may bypass the opening area OA. Some of the data lines DL passing through the sensor area SA may be extended in the second direction DR2 to provide data signals to the auxiliary pixels Pa arranged up and down with the opening area OA interposed therebetween, and may be bypassed along the edge of the opening area OA in the fifth non-display area NDA5.

Some of the scan lines SL passing through the sensor area SA may be extended in the first direction DR1 to provide scan signals to the auxiliary pixels Pa arranged from left to right with the opening area OA interposed therebetween, and may be bypassed along the edge of the opening area OA in the fifth non-display area NDA5.

Referring to FIGS. 8, 9 and 14, these embodiments are different from the embodiments shown in FIG. 9 in that an opening area OA is further included in a partial area of the sensor area SA and the fifth non-display area NDA5 arranged to surround the opening area OA further includes a light leakage prevention wall PW for preventing or reducing instances of light leakage occurring.

For example, according to some embodiments, in the main display area DA0, the first pixel defining layer 119 may cover the edge of each of the first pixel electrodes 221. The first pixel defining layer 119 overlaps each of the first pixel electrodes 221, and includes a first opening OP1 that defines a light emission area of the pixel.

The first pixel defining layer 119 may be a black pixel defining layer (black PDL). That is, the first pixel defining layer 119 may include a black material that does not transmit light. For example, the first pixel defining layer 119 may include carbon black and an organic insulating material.

The first pixel defining layer 119 may include a spacer 120. The spacer 120 may be arranged to protrude from the upper surface of the first pixel defining layer 119 in a thickness direction. The spacer 120 may have any one shape of a prismoid, a prism, a truncated cone, a cylinder, a hemisphere, and a semi-spheroid.

The spacer 120 may include at least one transparent organic material selected from Benzo Cyclo Butene (BCB), polyimide (PI), polyamide (PA), acrylic resin, or phenol resin.

A groove G may be formed on a portion of the substrate SUB in the fifth non-display area NDA5 of the sensor area SA. For example, the groove G may be formed by removing a portion of the substrate SUB. The groove G may be formed along the opening area OA to have a concentric circle shape on the plane.

The groove G may have an undercut structure. The groove G may have an undercut structure in which a width of a portion passing through the substrate SUB is larger than a width of a portion passing through the inorganic insulating layer(s), for example, the buffer layer 111 and the first gate insulating layer 112.

The light leakage prevention wall PW may be arranged to overlap the groove G in the third direction DR3. According to some embodiments, the light leakage prevention wall PW may be arranged to cover an inner surface of the groove G, and may have a structure protruded on a peripheral area of the groove G in the third direction DR3.

The light leakage prevention wall PW may be formed of the same material as that of the first pixel defining layer 119 of the main display area DA0. That is, the light leakage prevention wall PW may include a black material that does not transmit light. For example, the light leakage prevention wall PW may include carbon black and an organic insulating material.

The second pixel defining layer 119' may cover the edge of each of the second pixel electrodes 221'. The second pixel defining layer 119' overlaps each of the second pixel electrodes 221', and includes a second opening OP2 defining a light emission area of the pixel.

However, the second pixel defining layer 119' formed in the sensor area SA may not be a black pixel defining layer (black PDL), unlike the first pixel defining layer 119 formed in the main display area DA0. That is, the second pixel defining layer 119' may be formed of a transparent material as light transmittance of a specific value or more is required.

Therefore, the second pixel defining layer 119' may be formed of the same material as that of the spacer 120 formed in the main display area DA0. That is, the second pixel defining layer 119' may include at least one transparent organic material selected from Benzo Cyclo Butene (BCB), polyimide (PI), polyimide (PA), acrylic resin, or phenol resin.

The organic light emitting diode OLED may be covered with the thin film encapsulation layer TFE, and may be protected from external particles or moisture. The thin film encapsulation layer TFE may include at least one organic encapsulation layer and at least one inorganic encapsulation layer. FIG. 14 shows that the thin film encapsulation layer TFE includes first and second inorganic encapsulation layers TFE1 and TFE3 and an organic encapsulation layer TFE2 interposed the first and second inorganic encapsulation layers. According to some embodiments, the number of organic encapsulation layers and the number of inorganic encapsulation layers and the deposition order of the organic and inorganic encapsulation layers may be changed.

The first and second inorganic encapsulation layers TFE1 and TFE3 may include one or more inorganic insulating materials such as aluminum oxide, titanium oxide, tantalum oxide, hafnium oxide, zinc oxide, silicon oxide, silicon nitride, and silicon oxynitride, and may be formed by a chemical vapor deposition CVD or the like. The organic encapsulation layer TFE2 may include a polymer-based material. The polymer-based material may include an acrylic resin, an epoxy resin, polyimide, polyethylene, and the like.

The organic encapsulation layer TFE2 may be formed by coating a monomer on the substrate 100 and then hardening the same, and a wall partition 500 may be provided in the fifth non-display area NAS to control a flow of the monomer and make sure of a thickness of the monomer (or organic encapsulation layer).

The wall partition 500 may include an organic insulating material, and may be a deposited structure of first to third sub-wall portions 510, 520 and 530, for example. The first to third sub-wall portions 510, 520, and 530 may be formed of the same material as that of the interlayer insulating layer 115, the planarization layer 117, and the second pixel defining layer 221', respectively.

The second inorganic encapsulation layer TFE3 may be located on the organic encapsulation layer TFE2. The planarization layer 610 may be positioned on the second inorganic encapsulation layer TFE3 located between the opening area OA and the wall partition 500. The planarization layer 610 may cover an area of the fifth non-display area NDA5, which is not covered with the organic encapsulation layer TFE2, thereby increasing flatness of the display panel near the opening area OA. Therefore, when components such as an anti-reflection member or a window are located on the display panel PN, the planarization layer 610 may prevent or reduce instances of the components failing to be coupled to, being separated from or being spaced apart from the display panel PN.

The planarization layer 610 includes an organic insulating material. The planarization layer 610 may include a photoresist (e.g., negative or positive photoresist).

The planarization layer 610 may be positioned on the thin film encapsulation layer TFE. The planarization layer 610 may spatially be separated from the organic encapsulation layer TFE2 by the second inorganic encapsulation layer TFE3. For example, the organic encapsulation layer TFE2 and the planarization layer 610 may spatially be separated from each other like the case that the planarization layer 610 is located on the second inorganic encapsulation layer TFE3 and the organic encapsulation layer TFE2 is located below the second inorganic encapsulation layer TFE3.

The organic encapsulation layer TFE2 and the planarization layer 610 may not be in direct contact with each other.

The planarization layer 610 may have a thickness of 5 μm or more A portion of the planarization layer 610 may overlap the organic encapsulation layer TFE2. A first end 610E1 of the planarization layer 610 may be extended onto the organic encapsulation layer TFE2 to overlap the organic encapsulation layer TFE2. A second end 610E2 of the planarization layer 610 faces the opening area OA. The second end 610E2 may be positioned on the same line as an end 100E of the substrate 100.

Referring to FIG. 15, these embodiments are different from the embodiments described with respect to FIG. 14 in that the second pixel defining layer 119' includes a first area 119A and a second area 119B.

For example, according to some embodiments, the first area 119A of the second pixel defining layer 119' may be formed to overlap the edge area of the transmission area TA in the third direction DR3. That is, the first area 119A may be formed so as not to overlap a central area of the transmission area TA in the third direction DR3.

The second area 119B of the second pixel defining layer 119' may be formed in the central area of the transmission area TA to overlap a partial area of the first area 119A in the third direction DR3. An upper surface of the first area 119A and an upper surface of the second area 119B may be located on the same plane.

The first area 119A may be formed of the same material as the first pixel defining layer 119 of the main display area DA0. That is, the first area 119A may include a black material that does not transmit light. For example, the light leakage prevention wall PW may include carbon black and an organic insulating material.

The second area 119B may be formed of the same material as that of the spacer 120 of the main display area DA0 simultaneously with the spacer 120. That is, the second area 119B may include at least one transparent organic material selected from Benzo Cyclo Butene (BCB), polyimide PI, polyamide PA, acrylic resin or phenol resin.

Referring to FIG. 16, these embodiments are different from the embodiments described with respect to FIG. 14 in that at least a portion of the plurality of second pixel defining layers 119' formed in the transmission area TA of the sensor area SA further includes a bank portion BK_1 and a protrusion portion PT_1.

For example, according to some embodiments, in the sensor area SA, the second pixel defining layer 119' may cover the edge of each of the second pixel electrodes 221'. The second pixel defining layer 119' overlaps each of the second pixel electrodes 221', and includes a second opening OP2 that defines a light emission area of the pixel. At least a portion of the second pixel defining layer 119' may further include a bank portion BK_1 and a protrusion portion PT_1.

The bank portion BK_1 may be formed of the same material as that of the first pixel defining layer 119 formed in the main display area DA0 simultaneously with the first pixel defining layer 119. That is, the bank portion BK_1 may include a black material that does not transmit light. For example, the first pixel defining layer 119 may include carbon black and an organic insulating material.

The protrusion portion PT_1 may be arranged to overlap the bank portion BK_1 in the third direction DR3. That is, the protrusion portion PT_1 may be formed to cover an upper surface of the bank portion PK and to be protruded in the third direction DR3. According to some embodiments, a distance from the upper surface of the substrate SUB to an upper surface of the protrusion portion PT_1 may be equal to a distance from the upper surface of the substrate SUB to the upper surface of the spacer 120 formed in the main display area DA0.

The protrusion portion PT_1 of the second pixel defining layer 119' may be formed of the same material as that of the spacer 120 formed in the main display area DA0. That is, the second pixel defining layer 119' may include at least one transparent organic material selected from Benzo Cyclo Butene (BCB), polyimide (PI), polyimide (PA), acrylic resin, or phenol resin.

Although the present disclosure has been described based on the embodiments of the present disclosure, this is only an example and is not intended to restrict the scope of embodiments according to the present disclosure. It will be understood by those of ordinary skill in the art that various modifications and applications may be made therein without departing from the spirit and scope of embodiments according to the present disclosure. For example, each component shown in the embodiments of the present disclosure may be carried out with various modifications. Further, differences related to such modifications and applications should be construed as being included in the scope of the present disclosure as defined in the appended claims, and their equivalents.

The invention claimed is:

1. A display device comprising:
   a substrate including a display area including main pixels, and a sensor area including auxiliary pixels and transmission areas;
   first anode electrodes corresponding to the main pixels;
   first pixel defining layers defining an opening which partially exposes the first anode electrodes;
   spacers on the first pixel defining layers and protruding in a thickness direction;
   second anode electrodes corresponding to the auxiliary pixels; and
   second pixel defining layers defining an opening which partially exposes the second anode electrodes,
   wherein the spacers and the second pixel defining layers are simultaneously formed of a same material.

2. The display device of claim 1, wherein the first pixel defining layers include carbon black and an organic insulating material.

3. The display device of claim 1, wherein the second pixel defining layers and the spacers include at least one transparent organic material selected from polyimide, polyamide, acrylic resin, or phenol resin.

4. The display device of claim 1, further comprising a component below a transmission area from among the transmission areas, wherein the component includes at least one of infrared, visible or acoustic sensors.

5. The display device of claim 1, wherein a size of one transmission area from among the transmission areas is larger than a size of one light emission area of the auxiliary pixels.

6. The display device of claim 1, wherein a number per unit area of the auxiliary pixels is less than a number per unit area of the main pixels.

7. A display device comprising:
   a substrate including a display area including main pixels, and a sensor area including auxiliary pixels and transmission areas;
   first anode electrodes corresponding to the main pixels;
   first pixel defining layers defining an opening which partially exposes the first anode electrodes;
   spacers on the first pixel defining layers and protruded in a thickness direction;
   second anode electrodes corresponding to the auxiliary pixels; and
   second pixel defining layers defining an opening which partially exposes the second anode electrodes,
   wherein the second pixel defining layers include bank portions and protrusion portions which cover the bank portions and are protruded in the thickness direction, and
   the first pixel defining layers and the bank portions are simultaneously formed of a same material.

8. The display device of claim 7, wherein the first pixel defining layers and the bank portions include carbon black and an organic insulating material.

9. The display device of claim 7, wherein the protrusion portions and the spacers include at least one transparent organic material selected from polyimide, polyamide, acrylic resin, or phenol resin.

10. The display device of claim 7, wherein a height from the substrate to an upper surface of the protrusion portions is equal to a height from the substrate to an upper surface of the spacers.

11. The display device of claim 7, further comprising a component below a transmission area from among the transmission areas, wherein the component includes at least one of infrared, visible or acoustic sensors.

12. The display device of claim 7, wherein a size of one transmission area is larger than a size of one light emission area of the auxiliary pixels.

13. The display device of claim 7, wherein a number per unit area of the auxiliary pixels is less than a number per unit area of the main pixels.

14. A display device comprising:
   a substrate including a display area including main pixels, a sensor area including auxiliary pixels and transmission areas, and an opening area in the sensor area, and including a non-display area between the sensor area and the opening area;
   first anode electrodes corresponding to the main pixels;
   first pixel defining layers defining an opening which partially exposes the first anode electrodes;
   first spacers on the first pixel defining layers;
   second anode electrodes corresponding to the auxiliary pixels; and
   second pixel defining layers defining an opening which partially exposes the second anode electrodes,
   wherein the display device further comprises a light leakage prevention wall in the non-display area and formed along the opening area, and
   the first pixel defining layers and the light leakage prevention wall are simultaneously formed of a same material.

15. The display device of claim 14, wherein the first pixel defining layers and the light leakage prevention wall include carbon black and an organic insulating material.

16. The display device of claim 14, wherein the second pixel defining layers and the spacers include at least one transparent organic material selected from polyimide, polyamide, acrylic resin, or phenol resin.

17. The display device of claim 14, further comprising a component below a transmission area from among the transmission areas, wherein the component includes at least one of infrared, visible or acoustic sensors.

18. The display device of claim 14, wherein a size of one transmission area is larger than a size of one light emission area of the auxiliary pixels.

19. The display device of claim 14, wherein a number per unit area of the auxiliary pixels is less than a number per unit area of the main pixels.

20. The display device of claim 14, further comprising a thin film encapsulation layer that covers the display area and the sensor area, wherein the thin film encapsulation layer includes a first inorganic encapsulation layer, an organic encapsulation layer, and a second inorganic encapsulation layer, which are sequentially deposited.

* * * * *